US011295956B2

(12) United States Patent
Chang et al.

(10) Patent No.: US 11,295,956 B2
(45) Date of Patent: Apr. 5, 2022

(54) SELECTIVE FORMATION OF TITANIUM SILICIDE AND TITANIUM NITRIDE BY HYDROGEN GAS CONTROL

(71) Applicant: Taiwan Semiconductor Manufacturing Co., Ltd., Hsinchu (TW)

(72) Inventors: Cheng-Wei Chang, Taipei (TW); Kao-Feng Lin, Hsinchu (TW); Min-Hsiu Hung, Tainan (TW); Yi-Hsiang Chao, New Taipei (TW); Huang-Yi Huang, Hsin-chu (TW); Yu-Ting Lin, Tainan (TW)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

(21) Appl. No.: 16/887,218

(22) Filed: May 29, 2020

(65) Prior Publication Data
US 2020/0294807 A1  Sep. 17, 2020

Related U.S. Application Data

(62) Division of application No. 15/983,216, filed on May 18, 2018, now Pat. No. 10,685,842.

(51) Int. Cl.
*H01L 21/285* (2006.01)
*H01L 21/28* (2006.01)
(Continued)

(52) U.S. Cl.
CPC .. *H01L 21/28518* (2013.01); *H01L 21/28061* (2013.01); *H01L 29/41791* (2013.01);
(Continued)

(58) Field of Classification Search
CPC ......... H01L 29/66795; H01L 29/41791; H01L 29/785; H01L 21/28518; H01L 21/28061; H01L 2029/7858
See application file for complete search history.

(56) References Cited

U.S. PATENT DOCUMENTS

| | | |
|---|---|---|
| 5,595,784 A | 1/1997 | Kaim et al. |
| 5,747,384 A | 5/1998 | Miyamoto |
| (Continued) | | |

OTHER PUBLICATIONS

A. Subramaniyan et al., "Investigation on critical thickness dependence of ALD TiN diffusion barrier in MOL," 2016 27th Annual SEMI Advanced Semiconductor Manufacturing Conference (ASMC), Saratoga Springs, NY, USA, 2016, pp. 313-315 (Year: 2016).*

*Primary Examiner* — Shih Tsun A Chou
(74) *Attorney, Agent, or Firm* — Sterne, Kessler, Goldstein & Fox P.L.L.C.

(57) ABSTRACT

The present disclosure relates to a method for fabricating a semiconductor structure. The method includes providing a substrate with a gate structure, an insulating structure over the gate structure, and a S/D region; depositing a titanium silicide layer over the S/D region with a first chemical vapor deposition (CVD) process. The first CVD process includes a first hydrogen gas flow. The method also includes depositing a titanium nitride layer over the insulating structure with a second CVD process. The second CVD process includes a second hydrogen gas flow. The first and second CVD processes are performed in a single reaction chamber and a flow rate of the first hydrogen gas flow is higher than a flow rate of the second hydrogen gas flow.

20 Claims, 11 Drawing Sheets

(51) Int. Cl.
  *H01L 29/417*  (2006.01)
  *H01L 29/66*   (2006.01)
  *H01L 29/78*   (2006.01)
  *H01L 29/49*   (2006.01)

(52) U.S. Cl.
  CPC .... *H01L 29/4933* (2013.01); *H01L 29/66795* (2013.01); *H01L 29/785* (2013.01); *H01L 2029/7858* (2013.01)

(56) References Cited

U.S. PATENT DOCUMENTS

| | | |
|---|---|---|
| 6,093,645 A | 7/2000 | Ameen et al. |
| 2002/0098691 A1 | 7/2002 | Sotome |
| 2009/0026626 A1 | 1/2009 | Matsuyama et al. |
| 2010/0240216 A1 | 9/2010 | Tada et al. |
| 2014/0306291 A1* | 10/2014 | Alptekin ........... H01L 29/41766 257/369 |
| 2016/0013104 A1* | 1/2016 | Hung ................ H01L 29/41791 257/288 |
| 2017/0278747 A1 | 9/2017 | Adusumilli et al. |
| 2018/0090583 A1* | 3/2018 | Choi ................. H01L 21/76855 |
| 2020/0411513 A1* | 12/2020 | Jambunathan ............................... H01L 21/823431 |

\* cited by examiner

SELECTIVE FORMATION OF TITANIUM SILICIDE AND TITANIUM NITRIDE BY HYDROGEN GAS CONTROL

CROSS-REFERENCE TO RELATED APPLICATIONS

This application is a divisional of U.S. patent application Ser. No. 15/983,216, titled "Selective Formation of Titanium Silicide and Titanium Nitride by Hydrogen Gas Control," filed May 18, 2018, the disclosure of which is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features can be arbitrarily increased or reduced for clarity of illustration and discussion.

DETAILED DESCRIPTION

Figure 1A:
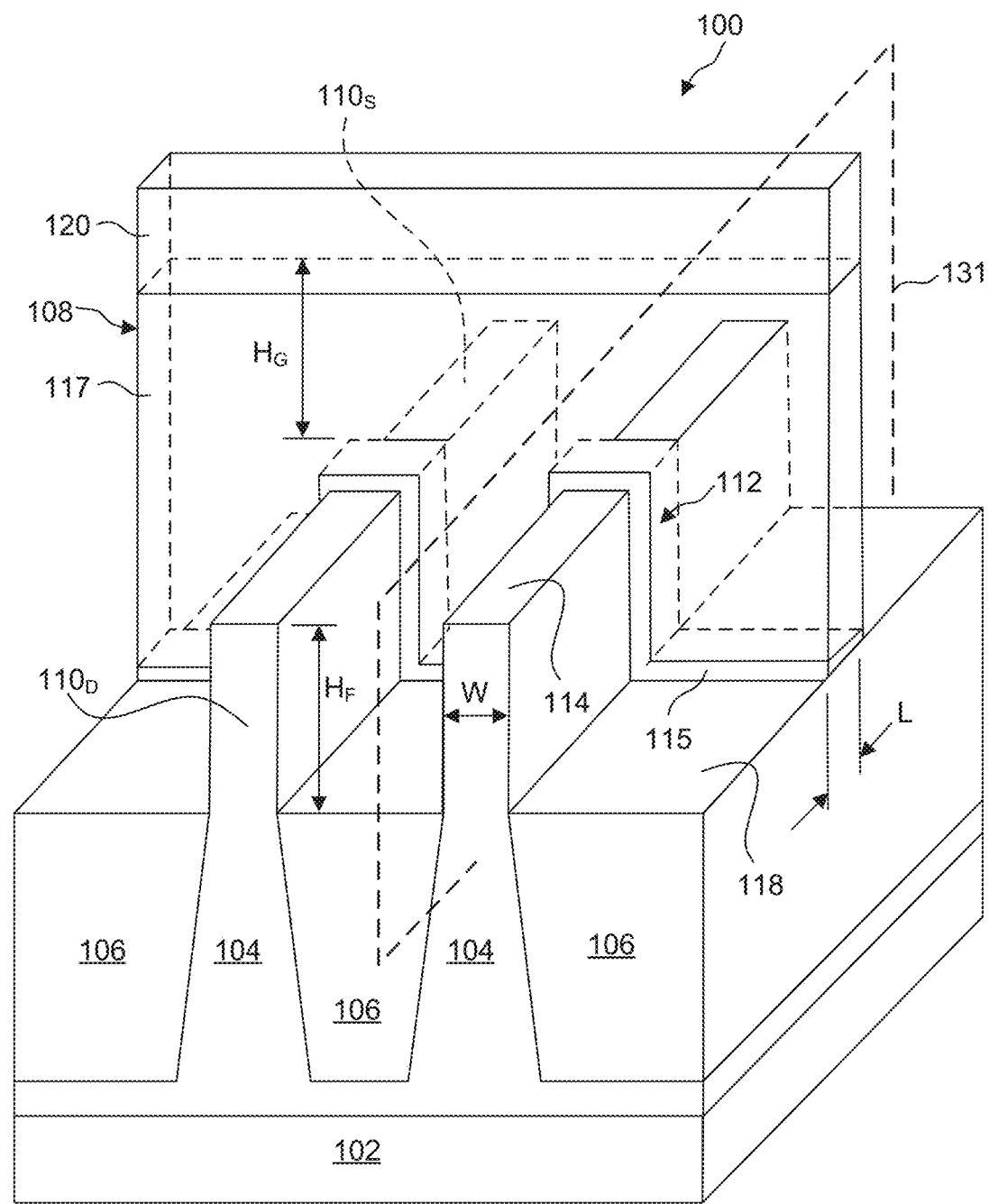
FIG. 1A illustrates an isometric view of an exemplary semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows can include embodiments in which the first and second features are formed in direct contact, and can also include embodiments in which additional features are disposed between the first and second features, such that the first and second features are not in direct contact. In addition, the present disclosure can repeat reference numerals and/or letters in the various examples.

Further, spatially relative terms, such as "beneath," "below," "lower," "above," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "finFET" refers to a FET that is formed over a fin that is vertically oriented with respect to the planar surface of a wafer.

"S/D" refers to the source and/or drain junctions that form terminals of a FET.

The term "vertical," as used herein, means nominally perpendicular to the surface of a substrate.

The expression "epitaxial layer" refers to a doped or undoped layer or structure.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

Metal interconnect (also referred to herein as "interconnect") transmits electrical signals between different elements of an IC. An electrical connection between an interconnect and a semiconductor device (e.g., a finFET) can be formed at a S/D region of the semiconductor device. A parasitic resistance between the interconnect and the semiconductor device can be related to an RC delay of the IC, thus affecting the performance/speed of the IC.

To improve electrical contact and reduce parasitic resistance, titanium silicide ($TiSi_x$) can be formed at the interface of the interconnect and the S/D region. Titanium nitride (TiN) is formed, as a barrier layer, on the sidewalls of gate structures adjacent to the S/D region to prevent the interconnect material from diffusing into the gate structures. The thicknesses of titanium silicide and titanium nitride are important in the functionality of these materials in the IC fabrication process, thus controlling the thicknesses of the two materials is desired.

Prior to forming the titanium silicide and titanium nitride layers, a titanium layer is formed, for example, by a physical vapor deposition (PVD) process. Subsequently, the titanium silicide and titanium nitride are formed from the titanium layer, for example, by a chemical vapor deposition (CVD) process. Because PVD and CVD processes can be performed in two different reaction chambers, placing/moving wafers between the reaction chambers during the fabrication process can cause undesirable outcomes, such as contamination to the wafers or increased fabrication time.

Further, as semiconductor devices (e.g., finFETs) decrease in dimensions, spacing between adjacent gate structures also decrease, and the contact region (e.g., the region that an interconnect forms electrical connection with a S/D region, including the top surface of the S/D region and the two adjacent gate structures) can have a high aspect ratio. In such high aspect-ratio configuration, the width of the bottom (e.g., the S/D region) of the contact region can be considerably shorter than the height of the sidewalls (e.g., the adjacent gate structures), resulting in less conformal deposition of titanium silicide and titanium nitride films in the contact region.

In accordance with various embodiments of this disclosure, using the deposition and in-situ treatment process to form titanium silicide and titanium nitride layers in semiconductor structures provides, among other things, the benefits of (i) titanium silicide and titanium nitride layers with improved conformality and uniformity; (ii) increased coverage of titanium silicide over the S/D region; (iii) titanium silicide and titanium nitride layers with improved film quality; and (iv) improved control over the thicknesses of the titanium silicide and titanium nitride layers.

FIGS. 1-9 illustrate titanium silicide and titanium nitride fabrication processes in various semiconductor devices using a CVD and in-situ treatment method. The fabrication process can form titanium silicide and titanium nitride layers with conformal and controlled thicknesses. The thickness ratio between the titanium silicide and titanium nitride layers can be controlled during the fabrication process. Although finFETs with high aspect ratio contact regions are illustrated, the disclosed method can be used in other devices and structures. For example, the disclosed method can be used to form titanium silicide and titanium nitride layers in planar device surfaces, trenches, and/or gaps with high or low aspect ratio, and finFETs with multiple fins. The fabrication processes provided herein are exemplary, and alternative processes in accordance with this disclosure can be performed that are not shown in these figures.

FIG. 1A is an isometric view of semiconductor structure 100, in accordance with some embodiments of the present disclosure. Semiconductor structure 100 includes finFETs. Semiconductor structure 100 includes a substrate 102, a plurality of fins 104, a plurality of isolation structures 106, and a gate structure 108 that is disposed over the sidewalls and top surface of each of fins 104. Fins 104 and isolation structures 106 have top surfaces 114 and 118, respectively. Gate structure 108 includes a gate dielectric layer 115 and a gate electrode structure 117. In alternative embodiments, one or more additional layers or structures can be included in gate structure 108. For illustrative purposes, only one gate structure 108 is shown in FIG. 1A. In the following description, more than one gate structure 108 is used to describe the present disclosure. FIG. 1A shows a hard mask 120 disposed on a top surface of gate electrode structure 117. Hard mask 120 is used to pattern, such as by etching, gate structure 108. In some embodiments, hard mask 120 includes a dielectric material, such as silicon nitride. The isometric view of FIG. 1A is taken after the patterning process (e.g., etching) of a gate dielectric layer and a gate electrode layer to form gate structure 108. FIG. 1A shows only one gate structure 108. ICs can include a plurality of gate structure(s).

Each of the plurality of fins 104 shown in FIG. 1A includes a pair of S/D terminals. For ease of description, S/D terminals include a source region $110_S$ and a drain region $110_D$, where S/D terminals are formed in, on, and/or surrounding fin 104. A channel region 112 of fin 104 underlies gate structure 108. Gate structure 108 has a gate length L, and a gate width ($2 \times H_F + W$), as shown in FIG. 1A. In some embodiments, gate length L is in a range from about 10 nm to about 30 nm. In some other embodiments, gate length L is in a range from about 3 nm to about 10 nm. In some embodiments, a fin width W is in a range from about 6 nm to about 12 nm. In some other embodiments, fin width W is in a range from about 4 nm to about 6 nm. Gate height $H_G$ of gate structure 108, measured from fin top surface 114 to the top of gate structure 108, is in a range from about 50 nm to about 80 nm, in some embodiments. Fin height $H_F$ of fin 104, measured from the isolation structure top surface 118 to fin top surface 114, is in a range from about 25 nm to about 35 nm, in some embodiments.

Substrate 102 can be a silicon substrate. Alternatively, substrate 102 can include other elementary semiconductors, such as germanium (Ge); a compound semiconductor including silicon carbide (SiC), gallium arsenide (GaAs), gallium phosphide (GaP), indium phosphide (InP), indium arsenide (InAs), and/or indium antimonide (InSb); an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or combinations thereof. In some embodiments, substrate 102 is a semiconductor on insulator (SOI). In some embodiments, substrate 102 can be an epitaxial material.

Isolation structures 106 include a dielectric material, such as silicon oxide ($SiO_x$), spin-on-glass (SOG), silicon nitride (SiN), silicon oxynitride (SiON), fluorine-doped silicate glass (FSG), a low-k dielectric material, any other suitable insulating material, or any combination thereof. Isolation structures 106 can be shallow trench isolation (STI) structures. In some embodiments, isolation structures 106 are STI structures and are formed by etching trenches in substrate 102. The trenches can then be filled with the insulating material, followed by a chemical mechanical polish/planarization (CMP) and etch-back. Other fabrication techniques for isolation structures 106 and/or fin 104 are possible. Isolation structures 106 can include a multi-layer structure, for example, having one or more liner layers.

Fins 104 are active regions where one or more transistors are formed. Fin 104 can include silicon or another elementary semiconductor, such as Ge; a compound semiconductor including SiC, GaAs, GaP, InP, InAs, and/or InSb; an alloy semiconductor including SiGe, GaAsP, AlInAs, AlGaAs, GaInAs, GaInP, and/or GaInAsP; or combinations thereof. Fins 104 can be fabricated using suitable processes, including photolithography and etch processes. The photolithography process can include forming a photoresist layer (resist) overlying the substrate (e.g., on a silicon layer), exposing the resist to a pattern, performing post-exposure bake processes, and developing the resist to form a masking element including the resist. The masking element can then be used to protect regions of the substrate while an etch process forms recesses into isolation structures 106, leaving protruding fins. The recesses can be etched using reactive ion etch (ME) and/or other suitable processes. Numerous other methods to form fins 104 on substrate 102 can be suitable. Fins 104 can include epitaxial material, in accordance with some embodiments.

Gate structure 108 can include a gate dielectric layer 115, a gate electrode structure 117, a spacer layer 111, and/or one or more additional layers. For ease of description, spacer layer 111 is not shown in FIG. 1A. In some embodiments, gate structure 108 uses polysilicon as gate electrode structure 117. Also shown in FIG. 1A is hard mask 120 disposed on a top surface of gate electrode structure 117. Hard mask 120 is used to pattern, such as by etching, gate structure 108. In some embodiments, hard mask 120 and spacer layer 111 include dielectric materials, such as SiN, SiO$_x$, any other suitable insulating material, or any combination thereof.

Although the isometric view of FIG. 1A shows gate structure 108 using polysilicon as gate electrode structure 117, in some embodiments, gate structure 108 can be a sacrificial gate structure such as formed in a replacement gate process used to form a metal gate structure. The replacement gate process is not shown in the figures. The metal gate structure can include barrier layer(s), gate dielectric layer(s), work function layer(s), fill metal layer(s), any other suitable material for a metal gate structure, or any combination thereof. In some embodiments, the metal gate structure can further include capping layers, etch stop layers, other suitable layers, or any combination thereof.

Exemplary p-type work function metals that can be included in the metal gate structure include TiN, tantalum nitride (TaN), ruthenium (Ru), molybdenum (Mo), aluminum (Al), tungsten nitride (WN), zirconium silicide (ZrSi$_2$), molybdenum silicide (MoSi$_2$), tantalum silicide (TaSi$_2$), nickel silicide (NiSi$_2$), other suitable p-type work function materials, or combinations thereof. Exemplary n-type work function metals that can be included in the metal gate structure include Ti, silver (Ag), tantalum aluminide (TaAl), tantalum aluminide carbide (TaAlC), tantalum aluminide nitride (TiAlN), tantalum carbide (TaC), tantalum carbide nitride (TaCN), tantalum silicide nitride (TaSiN), manganese (Mn), zirconium (Zr), other suitable n-type work function materials, or combinations thereof. A work function is associated with the material composition of the work function layer, and thus, the material of the first work function layer is chosen to tune its work function so that a desired threshold voltage Vt is achieved in the device that is to be formed in the respective region. The work function layer(s) can be deposited by CVD, plasma-enhanced vapor deposition (PECVD), ALD, any other suitable process, or any combination thereof. The fill metal layer can include Al, tungsten (W), copper (Cu), any other suitable material, or any combination thereof. The fill metal can be formed by CVD, PVD, plating, any other suitable process, or any combination thereof. The fill metal can be deposited over the work function metal layer(s), thereby filling in the remaining portion of the trenches or openings formed by the removal of the sacrificial gate structure.

Semiconductor structure 100 described above includes fins 104 and gate structure 108. For simplicity, other features are not shown in FIG. 1A, such as lightly-doped-drain (LDD) regions and doped S/D structures. LDD regions are lightly-doped regions disposed between the channel region of a transistor and at least one of the transistor's S/D regions. Ion implantation is an example doping process to form the LDD regions.

Figure 1B:
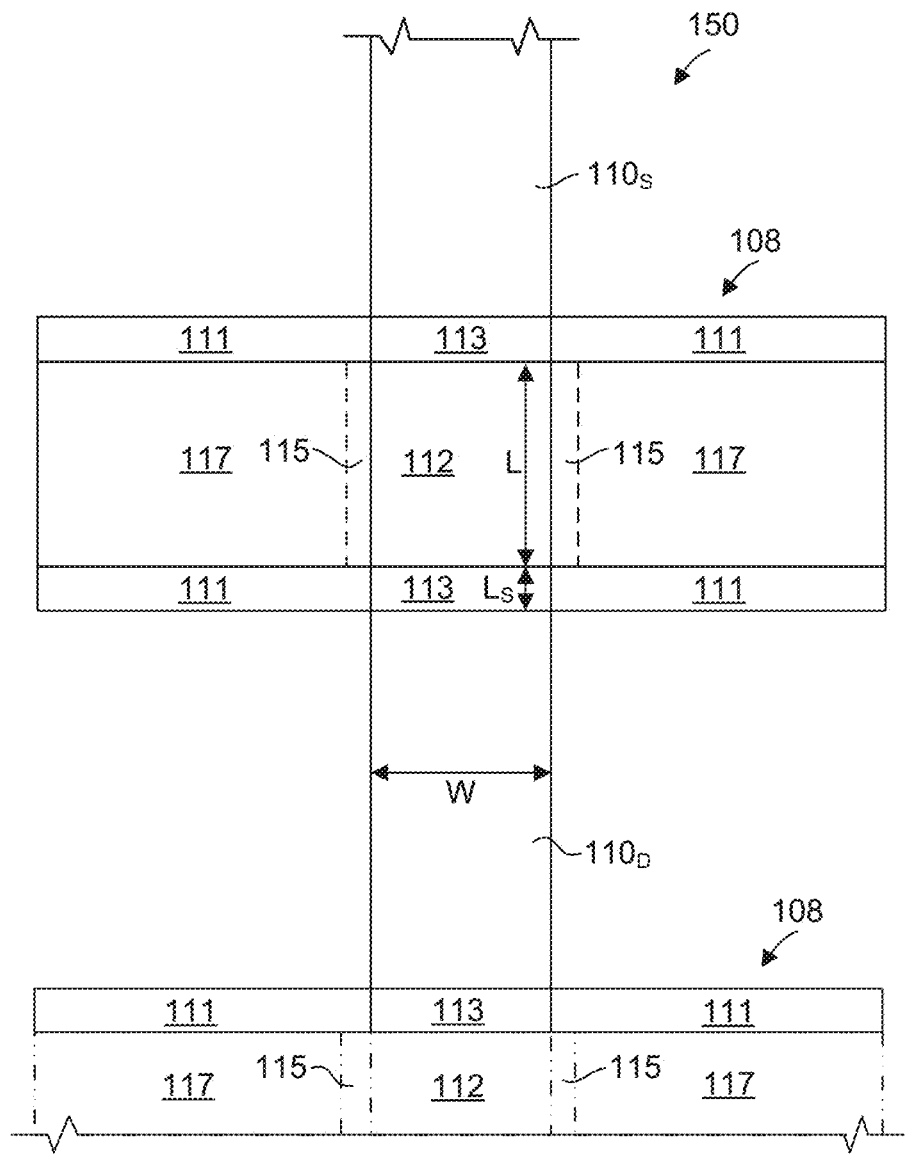
FIG. 1B illustrates a top view of an exemplary transistor region in the semiconductor structure illustrated in FIG. 1A.

FIG. 1B shows a top view of a transistor region 150 formed with one of the fins 104 of FIG. 1A and taken on a surface level with top surface 118 of isolation structure 106. Transistor region 150 includes S/D regions 110$_S$ and 110$_D$. Transistor region 150 also includes a channel region 112, which is part of fin 104 and is surrounded by gate structure 108 on three sides, as shown in FIG. 1A. Channel region 112 underlies gate structure 108 and has a width (fin width) W. Depending on fabrication processing conditions and device designs, the length of channel region 112 can be different from gate length L. Solely for the ease of description, the length of channel region 112 is denoted as gate length L. Transistor region 150 also includes gate dielectric layer 115 and gate electrode structure 117. FIG. 1B also shows spacers 111 formed on gate structures 108. LDD regions 113 are formed in the top surface and side walls of fin 104. LDD region 113 has a width W and a length L$_S$. FIG. 1B also shows another gate structure 108 by dotted lines. This other gate structure 108 has been described above as being similar and parallel to the gate structure 108 and is not shown in FIG. 1A. In the following description of FIGS. 2-7, two gate structures 108, as shown in FIG. 1B, are used to illustrate the present disclosure.

FIGS. 2 to 7 show various perspective and cross-sectional views of a partially fabricated finFET at various stages of fabrication according to various illustrative embodiments of the present disclosure. FIGS. 2 to 7 are described in detail below.

Figure 2:
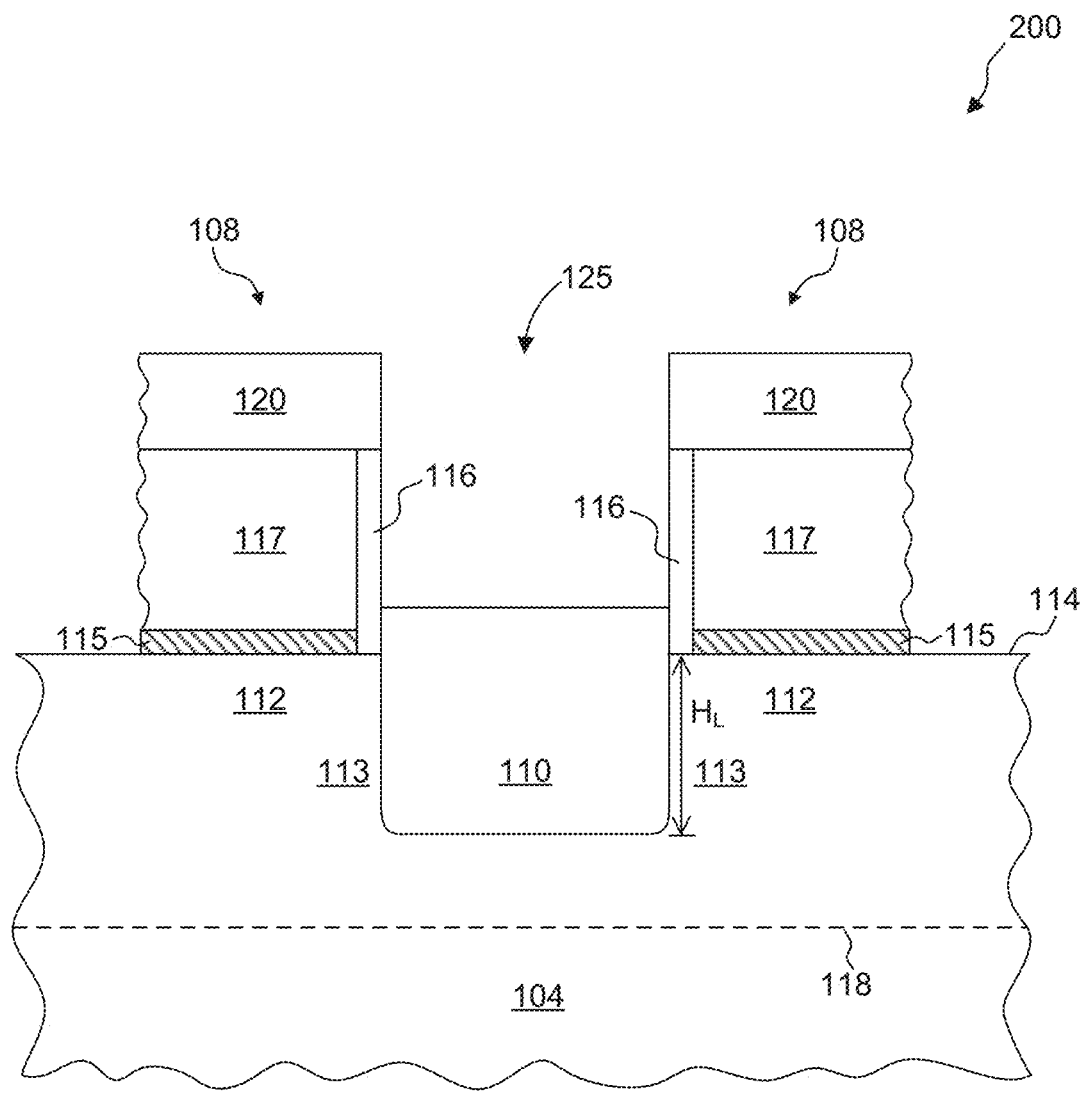
FIGS. 2-7 illustrate cross-sectional views of a partially fabricated finFET after each of a series processing operation, in accordance with some embodiments.

FIG. 2 shows two neighboring gate structures 108 formed over fin 104, taken along a cut line 131 shown in FIG. 1A. Although only one gate structure 108 is shown in FIG. 1A, in the present disclosure, cut line 131 is taken along two gate structures 108 (e.g., the two gate structures 108 in FIG. 1B) to illustrate the features of the present disclosure. Each gate structure 108 includes gate electrode structure 117 and gate dielectric layer 115. Hard mask 120 is disposed over gate electrode 117. In some embodiments, hard mask 120 is used to define the patterning of gate electrodes 117. Hard mask 120 includes SiN, SiON, SiC, silicon oxycarbide (SiOC), SOG, a low-k film, SiO$_x$, any other suitable material, or any combination thereof. In some embodiments, hard mask 120 includes SiO$_x$, which can be formed by any suitable method, including but not limited to CVD with tetraethoxysilane (TEOS) as a source gas, a PECVD, and a high-aspect-ratio-process (HARP). Channel regions 112 are under (e.g., directly under) gate structures 108. A dotted line 118 indicates the level of surfaces (e.g., the top surfaces or boundaries) of isolation structures 106.

FIG. 2 shows offset spacers 116 exposes a portion of the S/D region 110 and LDD region 113 between the two gate structures 108. Offset spacers 116 provides an offset distance, which is the thickness of offset spacer, from LDD region 113 and prevents dopants from being implanted in channel region 112, according to some embodiments. For illustrative purposes, other spacers, such as main spacers that can cover offset spacers 116 and gate structures 108, are not shown in FIG. 2.

Offset spacers 116 can be formed using any suitable method. For example, to form offset spacers 116, a blanket offset spacer layer is first deposited over substrate 102. An etch-back process can be used to remove portions of the blanket offset spacer layer to expose a portion of the channel region for ion implantation. The remaining blanket offset spacer layer forms offset spacers 116 at least on the sidewalls of gate electrode structures 117. The offset spacer can include a dielectric material, such as SiO$_x$, SiON, SiN, or any combination thereof. In some embodiments, deposition of the offset spacer can be performed by a PECVD process. Other suitable deposition processes can also be used to form offset spacers 116. In some embodiments, the thickness of offset spacer 116 is in a range from about 2 nm to about 4 nm.

LDD region 113 can be formed in fin 104 between adjacent offset spacers 116 using any suitable processes. For example, an ion implantation process is performed to form LDD region 113 and can utilize any suitable doping species. Although LDD region 113 is shown as being proximate to the top surface of fin 104, LDD region 113 can be proximate to both the top surface and sidewalls of fin 104. The LDD implantation can be performed vertically, or tilted toward the sidewalls of fin 104. Depending on the implantation process, LDD region 113 can extend to a certain depth below the surfaces of fin 104. For example, LDD region 113 can extend to a depth of HL below the top surface of fin 104, as shown in FIG. 2. LDD region 113 can also extend from the sidewall surfaces of fin 104 into the interior of fin 104. Substrate 102 can include both p-type and n-type devices. Additional processes, such as lithography patterning processes, can be used to separate the p-type device regions from dopant ions for n-type devices.

After the dopant ions are implanted, a thermal anneal can be performed to drive in and to activate the dopants. The thermal anneal can utilize rapid thermal processing (RTP) anneal, spike anneal, millisecond anneal, or laser anneal. Spike anneal can operate at a peak anneal temperature for a time period on the order of seconds. Millisecond anneal can operate at a peak anneal temperature for a time period on the order of milliseconds. Laser anneal can operate at a peak anneal temperature for a time period on the order of nanoseconds to microseconds.

Further, S/D region 110 can be formed in LDD region 113 in fin 104 between adjacent offset spacers 116 using any suitable process. For example, an ion implantation, using any suitable doping species, is performed to form S/D region 110. In another example, a portion of LDD region 113 between adjacent offset spacers 116 is removed and an epitaxial process is performed to grow suitable S/D material in between adjacent offset spacers 116. In-situ doping, using any suitable dopants, can be used to dope S/D region 110 to any suitable doping level. Based on different applications/embodiments, the depth of S/D region 110 from top surface 114 can be greater or less than depth HL of LDD region 113. Depending on the application, the lateral width of S/D region 110 can be less than, equal to, or greater than the lateral width of LDD region 113. A top surface of S/D region 110 can be higher than, substantially the same as, or lower than the top surface of gate dielectric layer 115. In some embodiments, S/D region 110 is formed by an epitaxial process, and a top surface of S/D region 110 is higher than the top surface of gate dielectric layer 115, as shown in FIG. 2.

In some embodiments, main spacers (not shown in FIG. 2) can be formed over transistor region 150. The main spacers can cover offset spacers 116 and top surfaces of gate structures 108. The thickness of the main spacers can be in a range from about 5 nm to about 10 nm, which is a thickness range that may be sufficient to protect gate structure 108 and the offset spacers 116 during possible subsequent processing of fin 104. The main spacers can be formed using an etch-back technique. For example, to form the main spacer, a blanket main spacer layer is first deposited over substrate 102, including gate structures 108 which have hard mask 120 over the structures. An etch-back process is then used to remove portions of the blanket main spacer layer to form an opening and expose a portion of LDD region 113 for subsequent formation of S/D region 110. The remaining blanket main spacer layer forms main spacers. The main spacers can include a dielectric material, such as SiON, SiN, carbon-doped silicon nitride (SiCN), or any combination thereof. SiCN has a relatively low etch rate against etchants, such as phosphoric acid ($H_3PO_4$) and hydrofluoric acid (HF), in comparison to SiN or SiON. In some embodiments, the deposition process to form the main spacers is PECVD. Other applicable deposition processes can also be used. A material removal process can be performed to remove main spacer material formed over hard mask 120 and other portions of surfaces of substrate 102. The material removal process can be, for example, a reactant ion etch (RIE) process and/or any other suitable process.

After LDD region 113 is exposed, in some embodiments, S/D region 110 can be formed. Optionally, any suitable doping process, e.g., ion implantation, is used to further increase the doping of S/D region 110. In another example, S/D region 110 can be partially etched, followed by an epitaxial growth of a semiconductor material. The semiconductor material can be the same as or different from substrate 102. For example, the semiconductor material can include one or more of Ge, Si, SiGe, other semiconductor alloys, or any combination thereof. Further, a titanium silicide layer can be formed over S/D region 110 (or at the interface of S/D region 110 and the subsequently-formed metal interconnect) to reduce contact resistance. A titanium nitride layer can further be formed over the titanium silicide layer as a barrier layer to prevent metal atoms of the interconnect from diffusing into gate structures 108. The formation of titanium silicide layer and titanium nitride layer are illustrated in FIGS. 3-7. In some embodiments, the titanium silicide layer is formed before the titanium nitride layer. In some embodiments, the titanium silicide layer and the titanium nitride layer can both be formed from a titanium layer by a CVD process. In the description below, the formation of the titanium silicide layer is illustrated first, followed by the description of the formation of the titanium nitride layer.

Figure 3:
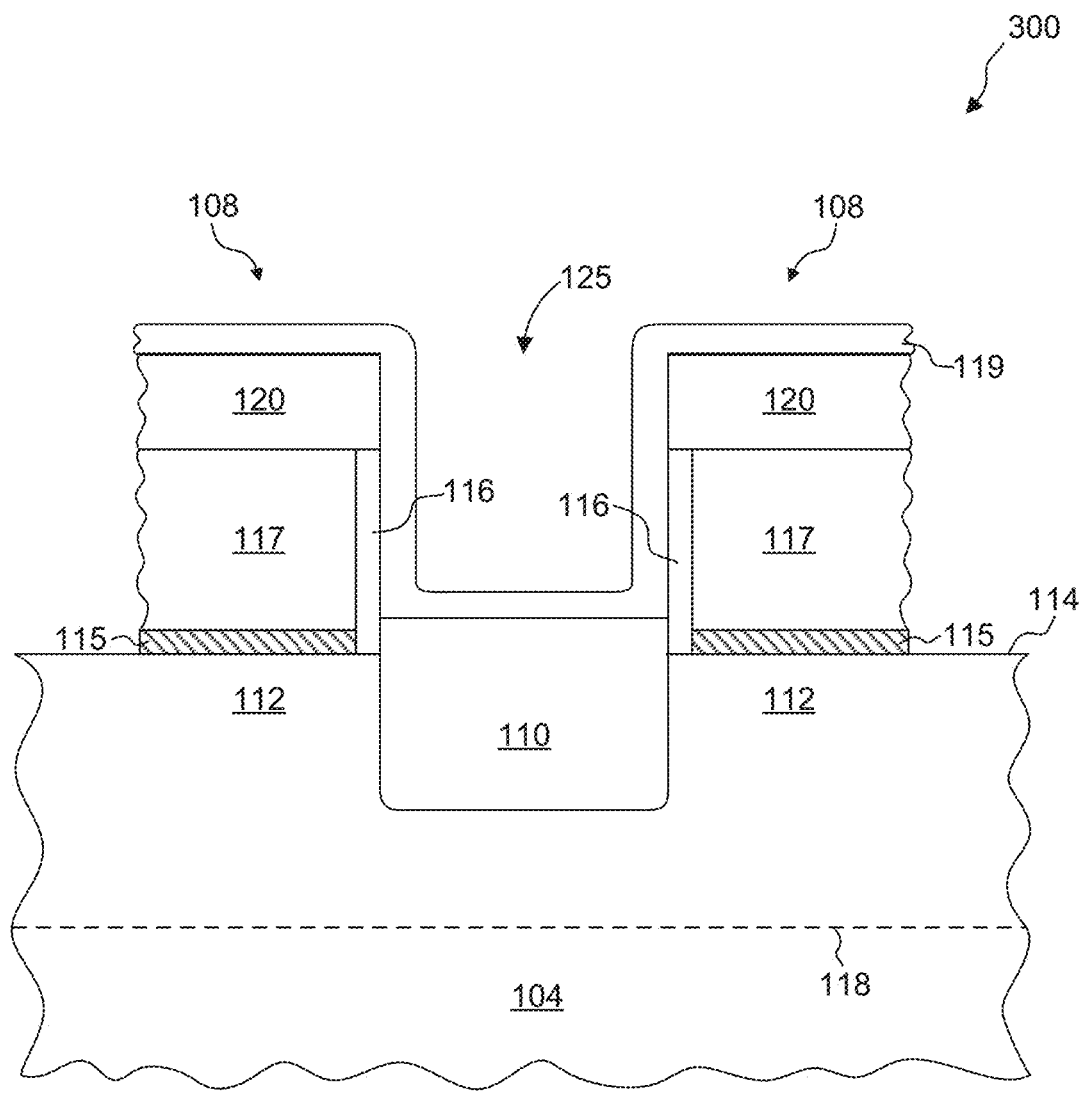
Figure 4:
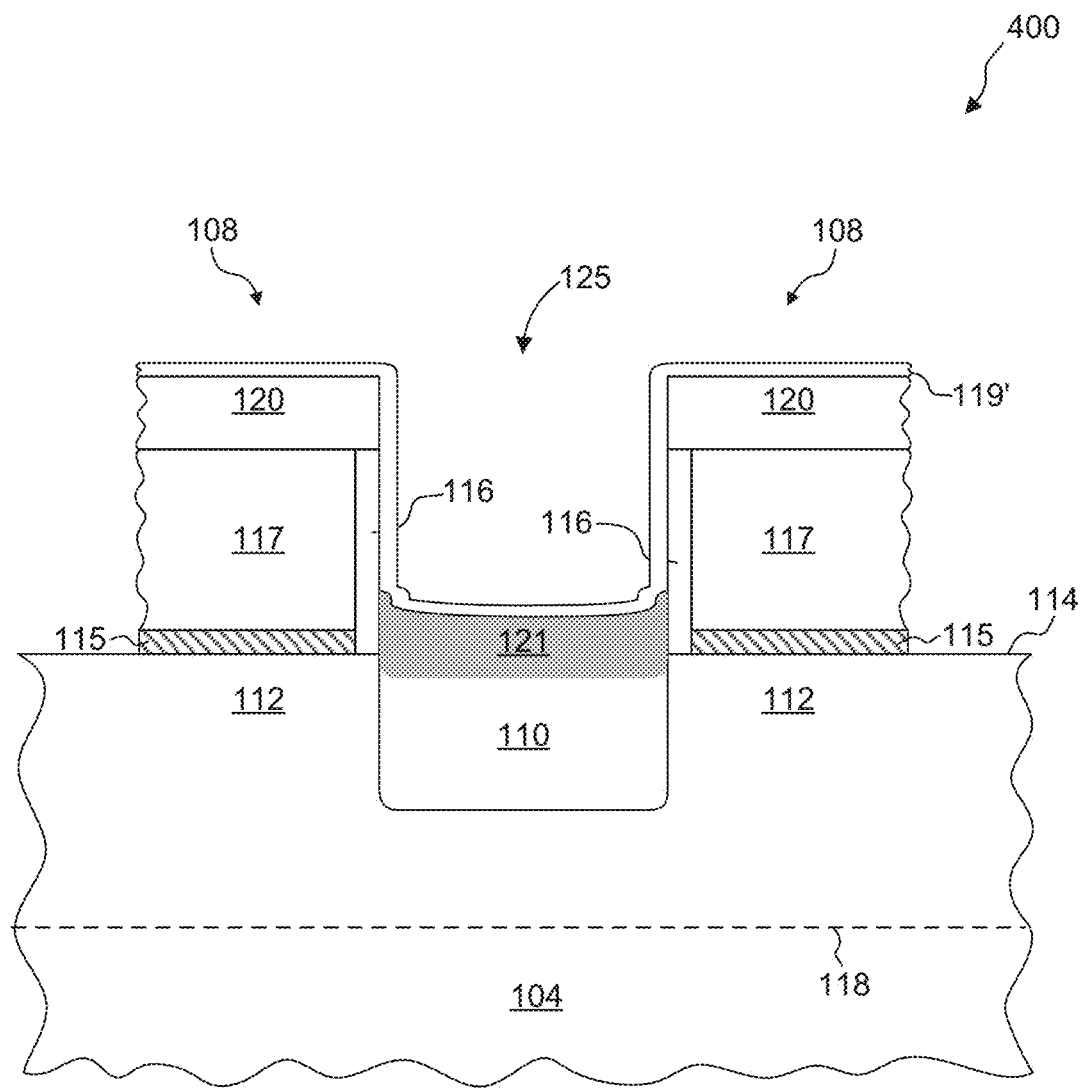
Figure 5:
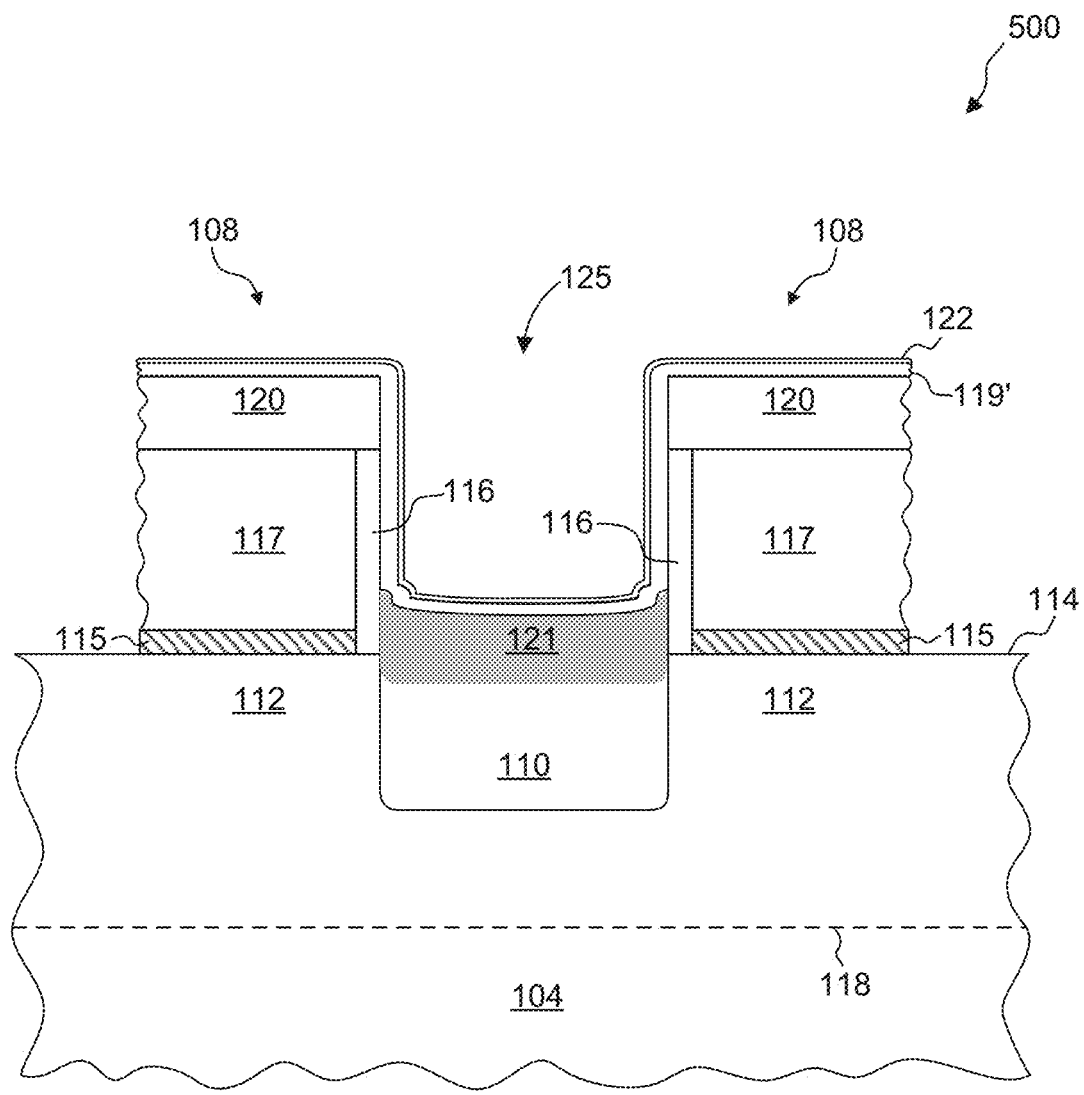

FIGS. 3-5 illustrate a process to form a titanium silicide layer, according to some embodiments of the present disclosure. For ease of description, the formation of titanium and titanium silicide is described separately. In some embodiments, the formation of titanium and titanium silicide can take place simultaneously or sequentially. For example, as titanium is formed over S/D region 110, a portion of titanium contacting S/D region 110 is converted to titanium silicide and other portions of titanium is etched back. In some embodiments, equations (1)-(4) do not indicate an order of chemical reactions. Details of the formation process is described below. Contact region 125 can refer to the region where a metal interconnect is filled in and contacts S/D region 110. For ease of description, only reactions/processes taking place in contact region 125 are described.

FIG. 3 shows an initial titanium layer 119 formed over and between adjacent gate structures 108. Initial titanium layer 119 can be formed over S/D region 110. In some embodiments, fin 104 includes silicon. Titanium (Ti) layer 119 and the subsequently-formed titanium silicide layer can be formed using any suitable method, such as PECVD. In some embodiments, other deposition methods, such as CVD and/or atom layer deposition (ALD), can also be used. An exemplary PECVD process to form initial titanium layer 119 can include chemical reactions (1) and (2) below.

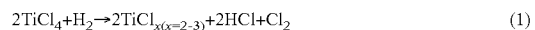

In some embodiments, a precursor gas titanium (IV) chloride ($TiCl_4$) can be flown into a PECVD chamber to react with hydrogen ($H_2$) to form an initial titanium layer. Argon (Ar can be used to produce and stabilize plasma under a radio frequency (RF) power throughout the PECVD process to form the titanium silicide layer. The generated plasma can enhance chemical reactions in the PECVD chamber. In reactions (1) and (2), a flow rate of $TiCl_4$ can be in the range of about 1 to about 20 standard cubic centimeter per minute (sccm), a flow rate of hydrogen can be in the range of about 500 to about 1500 sccm, a ratio of the flow rate of hydrogen to the flow rate of $TiCl_4$ can be in the range of about 25 to about 1500, and a flow rate of argon can be in the range of about 500 to about 2500 sccm, according to some embodiments. In some embodiments, a radio frequency (RF) power for the PECVD process is in the range of about 200 to about 750 W. The argon has a flow rate of about 40 to about 1200 sccm, according to some embodiments. The stage temperature of the PECVD process can be in the range of about 400 to about 450 degree Celsius (° C.). The deposition time can be determined by a desired thickness of titanium silicide layer in the subsequent processes. In some embodiments, the desired thickness of titanium silicide is in the range of about 7 nm to about 10 nm, and the deposition time is in the range of about 110 seconds to about 190 seconds.

In some embodiments, a relatively high flow rate of hydrogen, a relatively low flow rate of $TiCl_4$, and/or a relatively high ratio of the flow rate of hydrogen to the flow rate of $TiCl_4$ are used to selectively form titanium silicide. In some embodiments, the flow rate of $TiCl_4$ is about 3.5 sccm, the flow rate of hydrogen is about 1000 sccm, the RF power is about 300 W, the chamber pressure is about 2 Torr, the stage temperature is about 420 degree Celsius, the deposition time is about 10 seconds, and the flow rate of argon is about 800 sccm. The resulting ratio of the flow rate of hydrogen to the flow rate of $TiCl_4$ is about 286.

In some embodiments, the formation of initial titanium layer 119 starts from reaction (1). $TlCl_4$ can react with hydrogen to form $TlCl_{x(x=2-3)}$, which further reacts with hydrogen to form titanium in equation (2). The flow rate of hydrogen in equations (1) and (2) can affect the formation rate and amount of titanium. In some embodiments, a thicker initial titanium layer 119 can subsequently form a thicker titanium silicide layer at S/D region 110. The thicker titanium silicide layer can further reduce contact resistance at S/D region 110.

As initial titanium layer 119 is being formed, initial titanium layer 119 simultaneously undergoes an etch back process and reacts with S/D region 110 to form titanium silicide. The deposition process described in reactions (1) and (2) and the etch back process described in reaction (3) can result in titanium layer 119' to be formed over gate structures 108. FIG. 4 shows titanium layer 119'. The etch back can take place simultaneously with the formation of titanium due to the reaction of precursor gas $TiCl_4$ and initial titanium layer 119', according to some embodiments. In some embodiments, the deposition rate of titanium is higher than the etch back rate of titanium such that titanium layer 119' is formed. Meanwhile, while initial titanium layer 119 is consumed to form $TiCl_{x(x=2-3)}$, $TiCl_{x(x=2-3)}$ can react with silicon in S/D region 110, with the presence of hydrogen, to form titanium silicide in/over S/D region 110. In some embodiments, the thickness of titanium layer 119' over S/D region 110 is thinner than the thickness of titanium layer 119' over other locations (e.g., sidewalls of gate structures 108) of contact region 125. In some embodiments, initial titanium layer 119 over S/D region is fully consumed and little titanium remains over S/D region 110. For illustrative purposes, titanium layer 119' is shown over S/D region 110 in FIG. 4.

The reactions to form titanium layer 119' is now described in detail. In some embodiments, as titanium is being formed and $TiCl_4$ continues to flow into the chamber, at least a portion of initial titanium layer 119 reacts with $TiCl_4$ to form $TiCl_{x(x=2-3)}$. The formed $TiCl_{x(x=2-3)}$ over S/D region 110 can react with the substrate material (e.g., silicon) in S/D region 110 to form titanium silicide ($TiSi_{x(x=2-3)}$) over fin 104 (e.g., as a part of the S/D region). Meanwhile, portions of initial titanium layer 119 over other parts of contact region 125 (e.g., sidewalls of gate structures 108) can be partially or completely etched away. The chemical reactions to etch back initial titanium layer 119 and form titanium silicide layer 121 can be described in (3) and (4), which can take place simultaneously as or after reactions (1) and (2).

$$Ti + TiCl_4 \rightarrow TiCl_{x(x=2-3)} \quad (3)$$

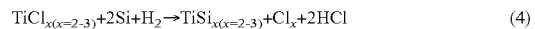

$$TiCl_{x(x=2-3)} + 2Si + H_2 \rightarrow TiSi_{x(x=2-3)} + Cl_x + 2HCl \quad (4)$$

According to reactions (3) and (4), the portion of initial titanium layer 119 contacting S/D region 110 can be converted to titanium silicide with the presence of silicon and hydrogen. In reaction (3), initial titanium layer 119 is etched back by reacting with $TiCl_4$ to form $TiCl_{x(x=2-3)}$. In reaction (4), $TiCl_{x(x=2-3)}$ and hydrogen react with the silicon in S/D region 110 to form titanium silicide over S/D region 110. Reaction (4) can be referred to as a "silicidation" process. In some embodiments, initial titanium layer 119 (e.g., over S/D region 110 and sidewalls of gate structures 108) can be partially or completely etched back to form $TiCl_{x(x=2-3)}$. In some embodiments, little or no titanium layer 119' remains as a result of reactions (3) and (4). In some embodiments, the $TiCl_{x(x=2-3)}$ generated in reactions (1) and/or (3) reacts with the portion of initial titanium layer 119 in S/D region 110 to form titanium silicide layer 121 of the desired thickness (e.g., in the range of about 7 nm to about 10 nm) over/in S/D region 110.

In some embodiments, in reactions (3) and (4), the flow rate of hydrogen is about 1000 sccm, the flow rate of $TiCl_4$ is about 3.5 sccm, the RF power is about 300 W, the flow rate of argon is about 800 sccm, and the chamber pressure is about 2 Torr. In some embodiments, the time periods for reactions (3) and (4) are dependent on or associated with, e.g., the flow rate of hydrogen, the ratio of the flow rate of hydrogen to the flow rate of $TiCl_4$, the deposition rate of titanium layer 119, the etch rate to titanium layer 119, and/or the RF power. The time period of (4) can vary so that the desired thickness of titanium silicide layer 121 is formed in S/D region 110. In some embodiments, the thickness of titanium silicide is in the range of about 7 to about 10 nm.

In some embodiments, the thickness of titanium silicide layer 121 is dependent on or associated with the flow rate of hydrogen and ratio of the flow rate of hydrogen to the flow rate of $TiCl_4$ in reactions (1) and (3). In some embodiments, the relatively high flow rate (e.g., 1000 sccm) of hydrogen can result in a high titanium deposition rate (e.g., in the range of about 0.1 Å/sec to about 3 Å/sec) through equations (1) and (3). Accordingly, a titanium silicide-rich texture can be formed in S/D region 110. In some embodiments, a high flow rate of hydrogen is used to form a desirably thick titanium silicide layer 121. In some embodiments, a relatively high flow rate of hydrogen (e.g., in the range of about 500 to about 1500 sccm) and a relatively low flow rate of $TiCl_4$ (e.g., in the range of about 1 to about 20 sccm) are used to selectively form titanium silicide over/in S/D region 110. In some embodiments, the flow rate of hydrogen can be adjusted to form a desired thickness of titanium silicide 121 layer in S/D region 110. In some embodiments, a top surface of titanium silicide layer 121 can be higher than the top surface of gate dielectric layer 115. A bottom surface of titanium silicide layer 121 can be higher than, substantially the same as, or lower than the gate dielectric layer 115, depending on the thickness of titanium silicide layer 121.

FIG. 5 shows another titanium layer 122 formed between and on adjacent gate structures 108. Titanium layer 122 can be deposited to subsequently form titanium nitride. For illustrative purposes, FIG. 5 shows titanium layer 119' resulted from the formation of titanium silicide layer 121, and titanium layer 122 is formed over titanium layer 119'. In some embodiments, titanium remains over contact region 125 (e.g., titanium layer 122 and titanium layer 119') is used to form titanium nitride. Titanium layer 122 can be formed through reactions (1) and (2), similar to the reactions to form initial titanium layer 119 illustrated in FIG. 3.

In some embodiments, to decrease the formation of titanium silicide and increase the formation of titanium nitride in the presence of $TiCl_4$, titanium, and hydrogen, the flow rate of hydrogen is decreased and the flow rate of $TiCl_4$ is increased in the formation of titanium nitride. The lower hydrogen flow rate and the higher $TiCl_4$ flow rate can suppress the formation of titanium silicide and promote the formation of titanium nitride. In some embodiments, a relatively low flow rate of hydrogen (e.g., in the range of about 5 to about 50 sccm), a relatively high flow rate of $TiCl_4$ (e.g., in the range of about 1 to about 20 sccm), and a resulting ratio of the flow rate of hydrogen to the flow rate of $TiCl_4$ of about 0.25 to about 50 are used to selectively form titanium nitride over titanium silicide. The selective formation of titanium nitride in a "nitridation" process is described below with reference to FIG. 6. In some embodiments, the deposition time to form titanium layer 122 is in the range from about 150 to about 5000 seconds. In some embodiments, the deposition time to form titanium layer 122 is about 150 seconds, the chamber pressure is about 1 Torr, the flow rate of $TiCl_4$ is about 10 sccm, the flow rate of hydrogen is about 10 sccm, the resulting ratio of the flow rate of hydrogen to the flow rate of $TiCl_4$ is about 1, and the flow rate of argon is about 600 sccm.

Figure 6:
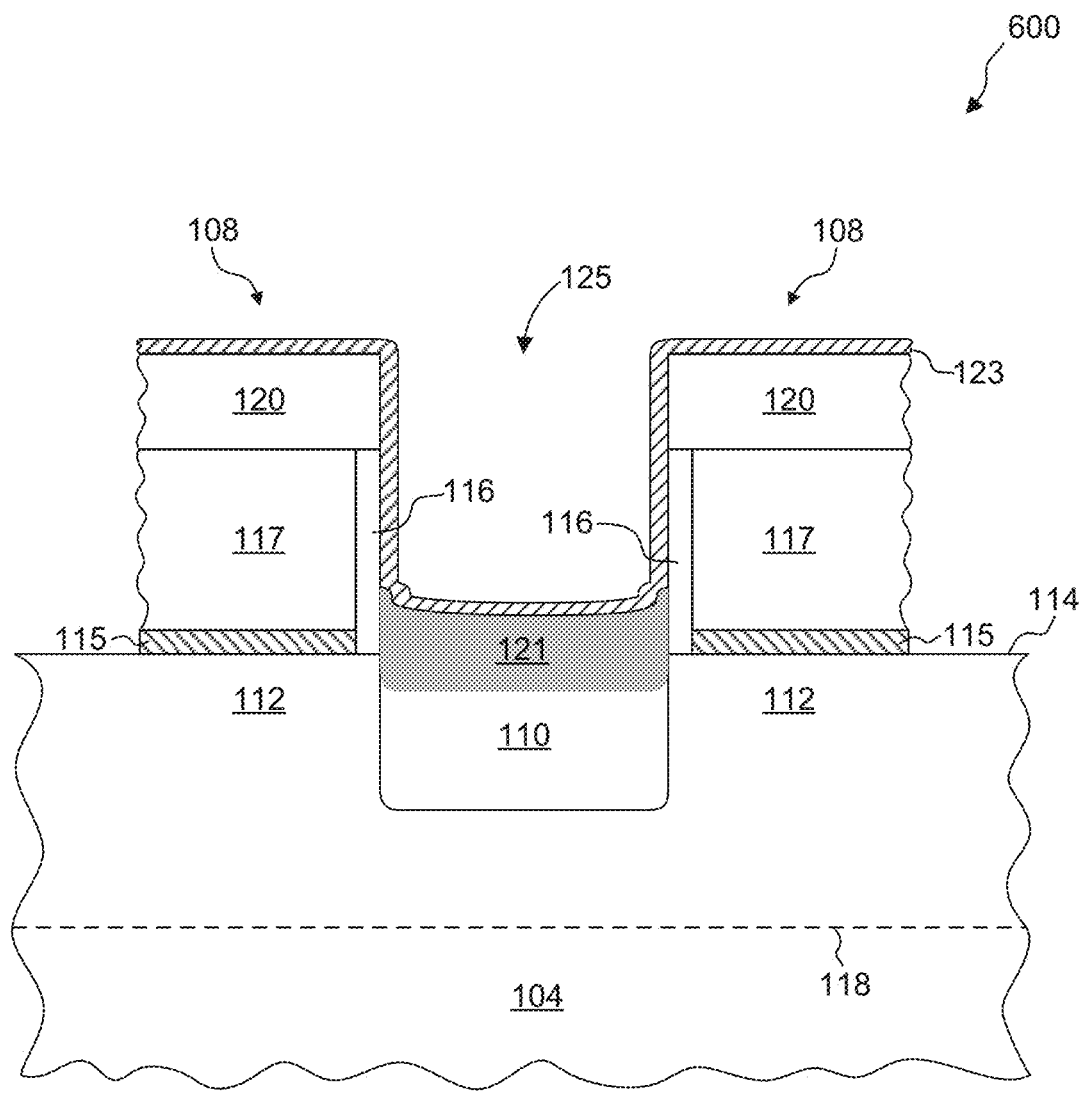

FIG. 6 shows titanium nitride layer 123 formed between and on adjacent gate structures 108. In some embodiments, titanium nitride layer 123 is formed over S/D region 110 and offset layers 116 of adjacent gate structures 108. In some embodiments, titanium nitride layer 123 is formed from the remaining titanium formed through equations (1)-(4) (e.g., titanium layers 122 and 119'). In some embodiments, the chemical reaction to form titanium nitride layer 123 includes reaction (5) below.

$$2Ti+2NH_3 \rightarrow 2TiN+3H_2 \quad (5)$$

In some embodiments, reaction (5) is referred to as a "nitridation" process. Argon is used to produce and stabilize plasma for the nitridation process. The reaction time of (5) (also referred to herein as "nitridation time") can be dependent on or associated with, e.g., the amount of titanium deposited and the flow rate of reacting gas (e.g., ammonia). In some embodiments, a thicker titanium layer (e.g., the total thickness of titanium layers 122 and 119') can result in a longer nitridation time to form titanium nitride layer 123. In some embodiments, nitrogen is flown into the PECVD chamber prior to and during reaction (5) as a part of the nitridation process. In the presence of nitrogen, ammonia and titanium can form nitrogen-passive titanium nitride, which can improve a barrier function between contact region 125 and a subsequently-formed contact layer. The flow rate of ammonia ($NH_3$) can be in the range of about 500 to about 5000 sccm, the flow rate of argon can be in the range of about 500 to about 2500 sccm, and the RF power can be in the range of about 200 to about 750 W. In some embodiments, the flow rate of ammonia is about 4000 sccm, the flow rate of argon is about 1000 sccm, and the RF power can be about 500 W. The nitridation time can be about 64 seconds. In some embodiments, the thickness of titanium nitride layer 123 can be in the range of about 1 to about 4 nm on spacer layers 116 of gate structures 108.

Using a relatively low flow rate of hydrogen and a relatively high $TiCl_4$ flow rate, compared with the flow rates of hydrogen and $TiCl_4$ for the formation of titanium silicide layer 121, a titanium nitride-rich texture can be selectively formed over offset spacers 116 of gate structures 108 through reaction (5). In some embodiments, by providing the described flow rates of hydrogen and $TiCl_4$, the nitridation process (e.g., reaction (5)) is more likely to take place than the silicidation process (e.g., reaction (4)) during the formation of titanium nitride layer 123. Thus, the flow rates of hydrogen and $TiCl_4$ can be controlled to form titanium nitride layer 123 with a desired thickness. The formed titanium nitride layer 123 can function as a barrier layer and prevent the subsequently-formed contact layer from diffusing into offset spacers 116 and gate electrode structures 117.

In some embodiments, the selectivity of titanium silicide over titanium nitride is defined as the ratio of total thickness of titanium silicide layer 121 over S/D region 110 to the total thickness of titanium nitride layer 123 over offset spacers 116. In some embodiments, the selectivity is in the range of about 3 to about 7.

Figure 7:
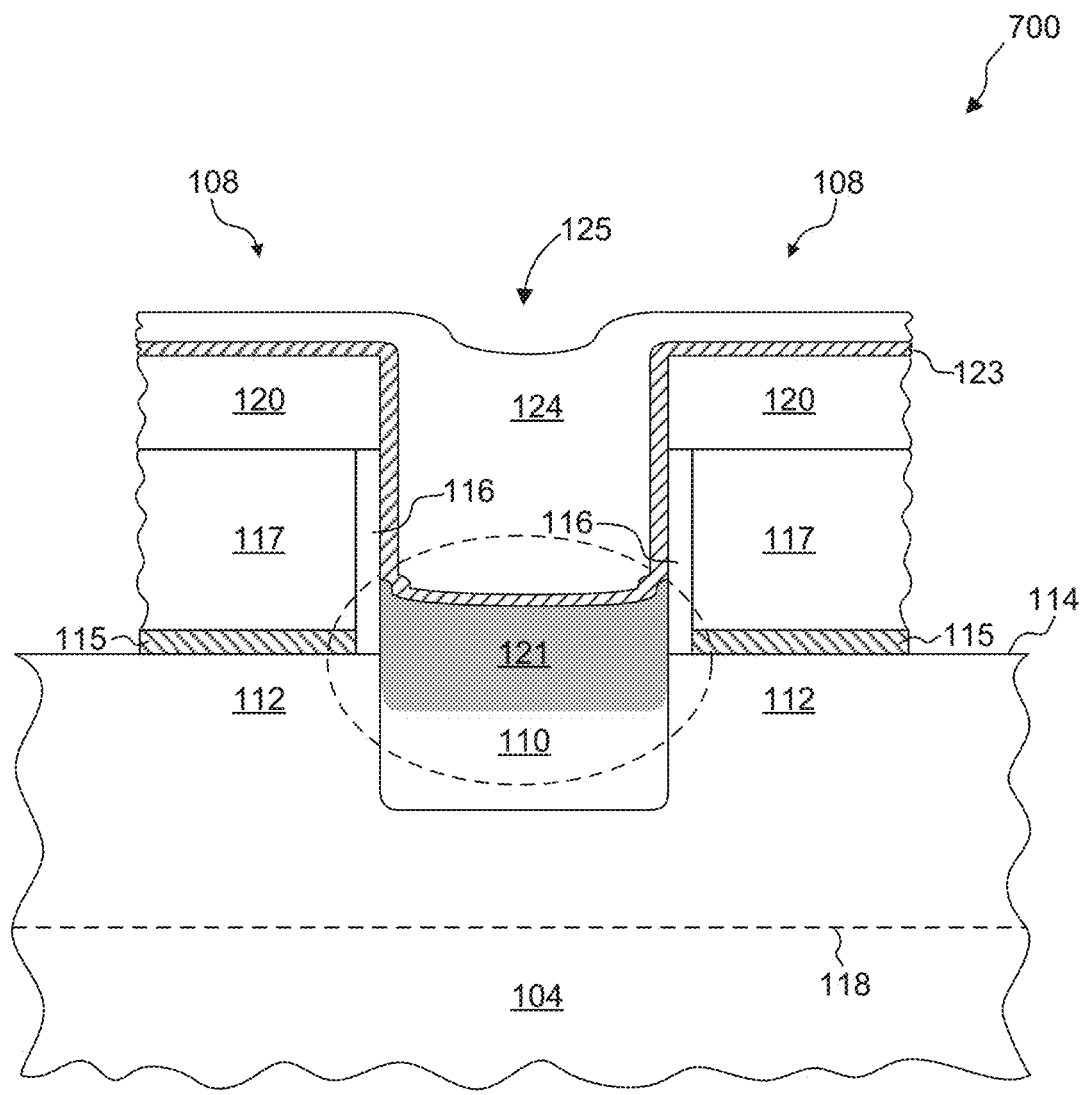

FIG. 7 shows titanium silicide layer 121 and titanium nitride layer 123 formed through reactions (1)-(5), and contact layer/plug 124 (e.g., a portion of an interconnect) formed in contact region 125, taken along cut line 131 shown in FIG. 1A. Contact layer 124 can form a contact with titanium nitride layer 123, which can prevent metal atoms in contact layer 124 from diffusing into offset spacers 116, gate structures 108, and/or S/D region 110. Titanium silicide layer 121 can reduce a parasitic resistance between contact layer 124 and S/D region 110. In some embodiments, contact layer 124 includes cobalt. In alternative embodiments, contact layer 124 includes other metal or metal alloys such as aluminum, copper, or the like. Contact layer 124 can be formed using appropriate deposition methods (e.g., CVD). For illustrative purposes, other byproducts, e.g., residual titanium and $Cl_x$ are omitted from FIG. 7. A portion of S/D region 110 is circled and illustrated in detail in FIG. 8.

Figure 8:
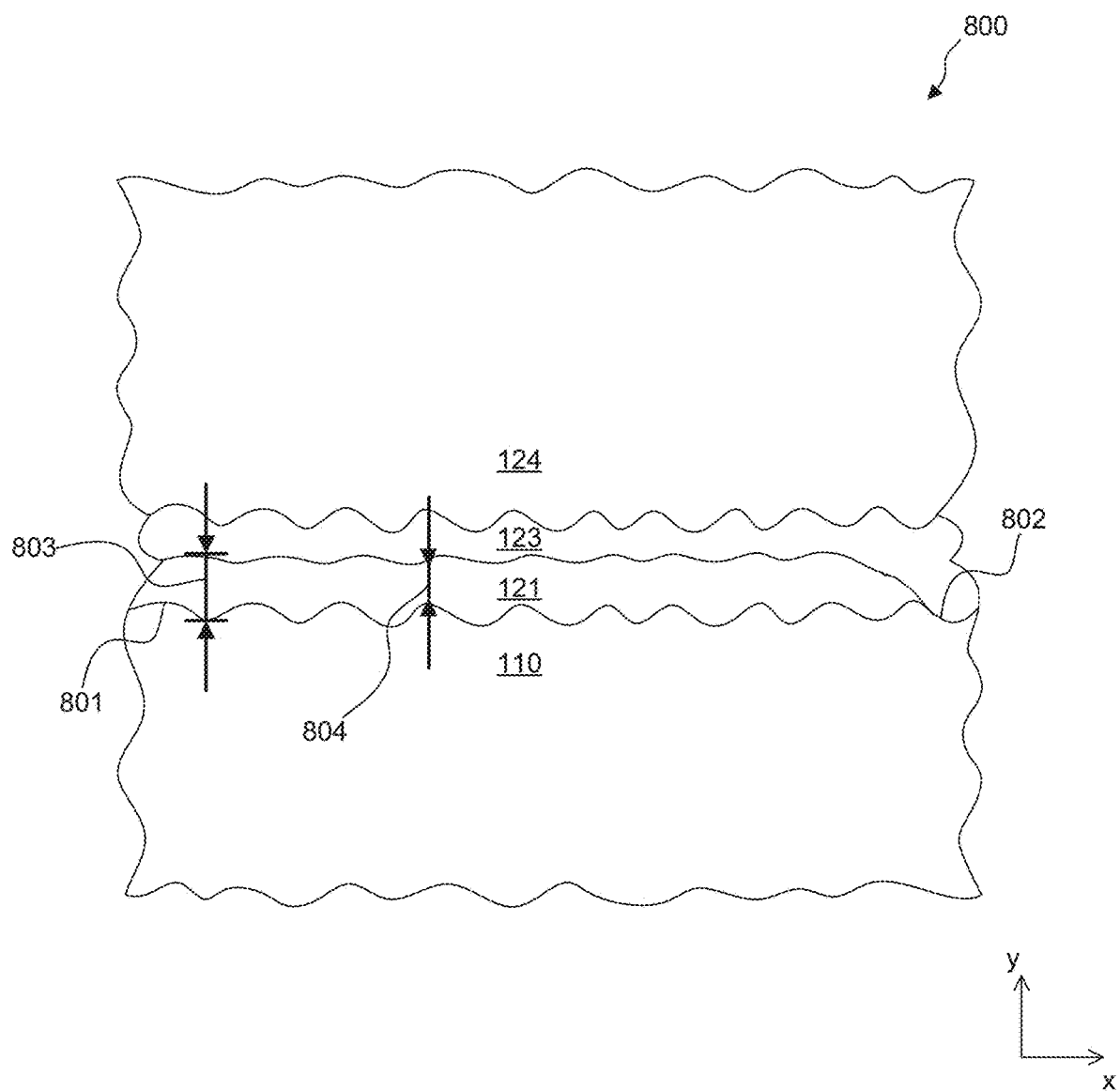
FIG. 8 illustrates an enlarged cross-sectional view of a portion of a source/drain (S/D) region circled in FIG. 7, in accordance with some embodiments.

FIG. 8 shows an exemplary enlarged cross-sectional view of S/D region 110 circled in dashed lines in FIG. 7. As shown in FIG. 8, S/D region 110 is covered by titanium silicide layer 121, which is further covered by titanium nitride layer 123. Contact layer 124 further covers titanium nitride layer 123 and titanium silicide layer 121.

In the cross-sectional view, along the horizontal direction (or x-axis), the curve length of the S/D region 110 covered by titanium silicide layer 121 is denoted as element 801 and the curve length of the S/D region 110 not covered by titanium silicide layer 121 is denoted as element 802. The total curve length of the cross section along x-axis is the sum of 801 and 802. The linear coverage of titanium silicide layer 121 over S/D region 110 is defined as the ratio of 801 to the sum of 801 and 802. The linear coverage of the present disclosure can be in the range of about 65% to about 81%. In some embodiments, the linear coverage of the present disclosure is about 72%.

Further, along the vertical direction (or y-axis), the length (or thickness) of titanium silicide layer 121 can be in the range of about 1.30 nm to about 19 nm. In some embodiments, the length of titanium silicide layer 121 is in the range of about 7 to about 10 nm. The maximum length of titanium silicide layer 121 is denoted as element 803 and the minimum length of titanium silicide layer 121 is denoted as element 804. In some embodiments, the ratio of $Min_{length}$ (the minimum length of titanium silicide layer 121 along y-axis) to $Max_{length}$ (the maximum length of titanium silicide layer 121 along y-axis) of the present disclosure can be in the range of about 35% to about 59%. In some embodiments, the ratio of $\text{Min}_{length}/\text{Max}_{length}$ of the present disclosure is about 47%.

By using PECVD, embodiments of the present disclosure can form titanium silicide layer 121 with improved coverage and uniformity over S/D region 110. The improved coverage and controlled thickness of titanium silicide layer 121 can reduce the parasitic resistance between S/D region 110 and contact layer 124. Meanwhile, the improved uniformity of titanium silicide layer 121 can further prevent the diffusion of contact layer 124 into S/D region 110.

In an N-type finFET formed by embodiments of the present disclosure, at normal distribution, a parasitic resistance of the S/D region 110 can be in the range of about 3795 to about 3980 ohms/fin. In some embodiments, the parasitic resistance is about 3823 ohms/fin, which is lower than the parasitic resistance (e.g., about 3991 ohms/fin) of an interface formed by a PVD method. In a P-type finFET formed by embodiments of the present disclosure, at normal distribution, the parasitic resistance of S/D region 110 can be in the range of about 3794 to about 3990 ohms/fin. In some embodiments, in the P-type finFET, the parasitic resistance is about 3830 ohms/fin, which lower than the parasitic resistance, (e.g., about 3987 ohms/fin) of an interface formed by a PVD method.

Figure 9:
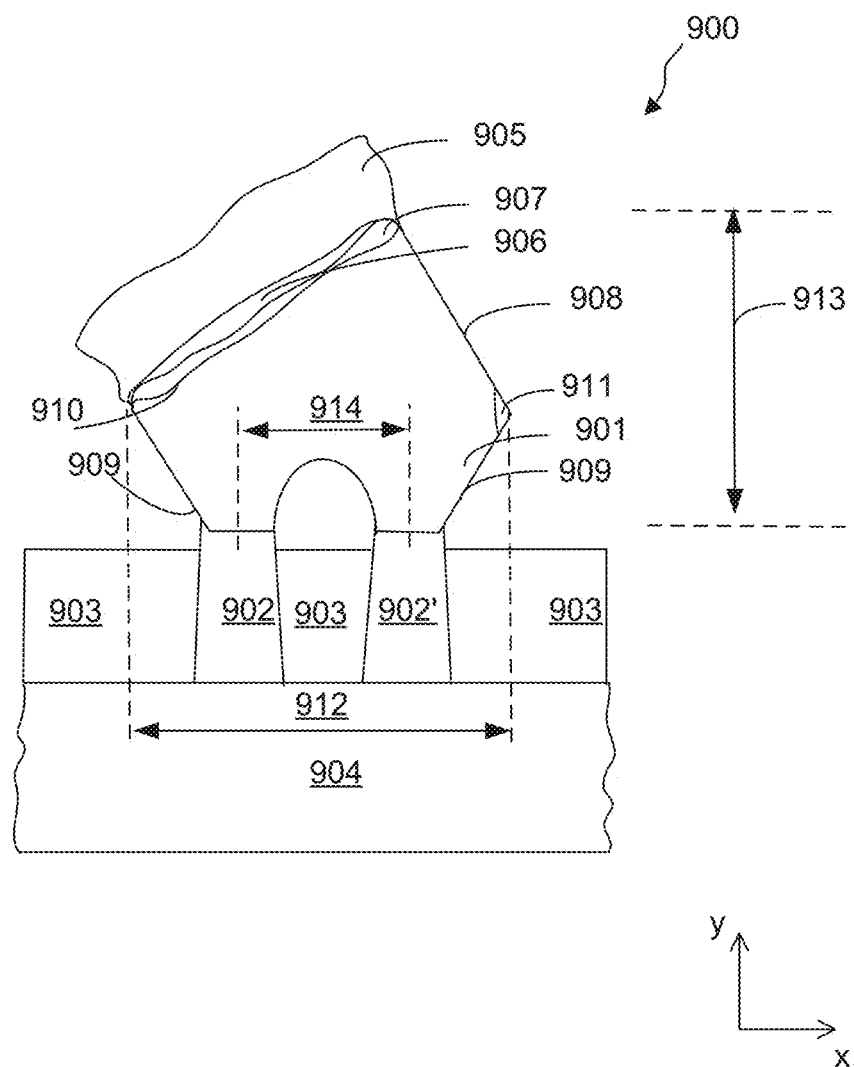
FIG. 9 illustrates an exemplary cross-sectional view of a merged fin structure, in accordance with some embodiments.

FIG. 9 is an exemplary cross-sectional view of a merged fin structure 900, according to some embodiments. Merged fin structure 900 can include a titanium silicide layer 901, a titanium nitride layer 906 over titanium silicide layer 907, and a contact layer 905 over the titanium nitride layer.

As shown in FIG. 9, fins 902 and 902' share a common S/D region 901. S/D region 901 can be an N-type region or a P-type region. In some embodiments, S/D region 901 merges two S/D regions, in which each S/D region is individually grown on fins 902 and 902'. In some embodiments, S/D region 901 can have a hexagonal-like shape or a partial hexagonal-like shape of FIG. 9. In some embodiments, fin pitch 914 can be between 10 and 40 nm. In some embodiments, S/D region 901 has a partial hexagonal-like shape, which has a top surface 910 and a plurality of side surfaces 908 and 909. An angle 911 is formed between side surfaces 908 and 909 that can range from approximately 45° to 65° according to some embodiments. S/D region 901 has a width 912 and a height 913, which both can be optimized for device performance. In some embodiments, width 912 can range from 50 to 90 nm and height 913 can range from 40 to 80 nm. As would be understood by a person of ordinary skill in the art, these dimensions are not limiting.

Further, merged fin structure 900 includes a substrate 904. In some embodiments, substrate 904 can be a bare semiconductor wafer or a top layer of a semiconductor on insulator (SOI) wafer. By way of example and not limitation, a semiconductor substrate can be made of silicon or another elementary semiconductor. For example, the elementary semiconductor can be (i) germanium; (ii) a compound semiconductor including silicon carbide, gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) any combinations thereof. Further, fins 902 and 902' can be made from the same material as semiconductor substrate 904 or from a different material. By way of example and not limitation, fins 902 and 902' are made of silicon.

Fins 902 and 902' of merged fin structure 900 are electrically isolated from each other with a shallow trend isolation (STI) layer 903. STI layer 903 can be silicon oxide, silicon nitride, silicon oxynitride, fluorine-doped silicate glass (FSG), a low-k dielectric material, and/or other suitable dielectric material with appropriate gap fill properties. STI layer 903 can be formed after the fin formation on substrate 904 but before the formation of S/D region 901. For example, the space between the fins can be filled with dielectric material, followed by partial chemical mechanical planarization (CMP) and etch-back of the dielectric material to expose fins 902 and 902'. Other fabrication methods for forming STI layer 903 are possible. Further, STI layer 903 can be a multi-layer structure that includes more than one layer of the aforementioned materials.

In some embodiments, S/D region 901 can be an epitaxial stack that includes two or more epitaxial layers grown in succession and feature the same or different dopant types and/or concentrations. The thickness of these layers can vary depending on the device performance requirements. In some embodiments, merged fin structure 900 includes a third epitaxial layer as a capping layer. For example, the first epitaxial layer can have a thickness range between 10 and 20 nm, the second epitaxial layer can have a thickness range between 30 and 60 nm, and the third epitaxial layer (capping layer) can have a thickness range less than 10 nm. In some embodiments, S/D region 901 can have the partial hexagonal-like shape shown in FIG. 9, which is the result of two merged "diamond-shaped" S/D regions—each of the S/D regions is grown on fins 902 and 902'. S/D width 912 can be monitored through an inline measurement.

In some embodiments, the epitaxial growth process of the epitaxial layers can be performed at high-wafer temperatures, e.g., ranging from 450 to 740° C. During the epitaxial growth, the process pressure can range between 1 and 100 Torr, and the reactant gases can include silane ($SiH_4$), disilane ($Si_2H_6$), germane ($GeH_4$), diborane ($B_2H_6$), hydrochloric acid (HCl), hydrogen ($H_2$), nitrogen ($N_2$), and/or argon (Ar). The aforementioned ranges and types of gases are exemplary and are not intended to be limiting. The shape and size of S/D region 901 may depend on the growth conditions of each individual epitaxial layer (e.g., gas flows, wafer temperature, and/or process pressure).

The disclosed titanium silicide layer and the titanium nitride layer can be formed over S/D region 901 of merged fin structure 900, using the same or similar processes. In some embodiments, as shown in FIG. 9, merged fin structure 900 has a partial hexagonal-like shape and top surface 910 is formed on one side of S/D region 901. Titanium silicide layer 907 can be formed over top surface 910, titanium nitride layer 906 can be formed over titanium silicide layer 907, and contact layer 905 can be formed over titanium nitride layer 906. In some embodiments, the layers (e.g., including the length along the y-axis and the coverage) and the interfaces between the layers shown in FIG. 9 can be similar to the layers and the interfaces illustrated in FIG. 8. For example, contact layer 905 can be similar to contact 124, titanium nitride layer 906 can be similar to titanium nitride layer 123, titanium silicide layer 907 can be similar to titanium silicide layer 121, and S/D region 901 can be similar to S/D region 110. In another example, the ratio of $\text{Min}_{length}$ to $\text{Max}_{length}$ of titanium silicide layer 907 along y-axis of merged fin structure 900 can be calculated in a similar way as illustrated in FIG. 8. In some embodiments, merged fin structure 900 has a hexagonal-like shape and the top surface of merged fin structure 900 can be substantially horizontal. The disclosed titanium silicide layer and the titanium nitride layer can be formed over the top surface in a similar configuration as illustrated in FIGS. 8 and 9.

Figure 10:
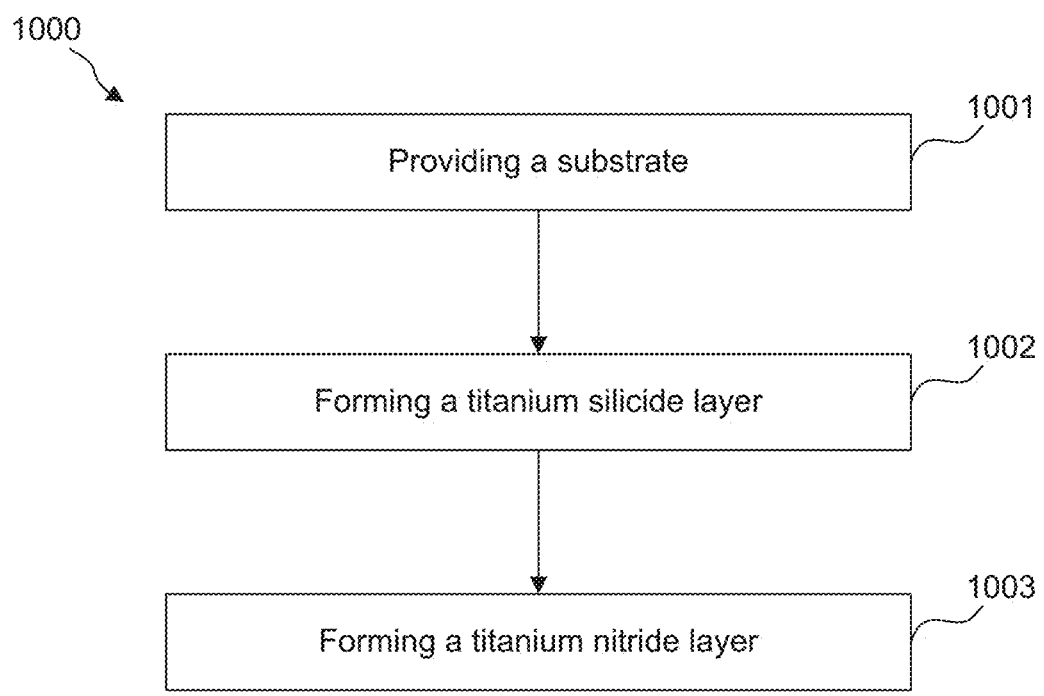
FIG. 10 is a flow diagram illustrating an exemplary fabrication method, in accordance with some embodiments.

FIG. 10 is a flow diagram of an illustrative method 1000 for forming contact region 125 with improved parasitic resistance. Other fabrication processes can also be performed between the various operations of method 1000 and are omitted here for clarity. For illustrative purposes, a PECVD process is used to describe operations 1001-1003.

In operation 1001, a substrate is provided. The substrate can be any suitable semiconductor substrate, such as silicon. The substrate can include finFETs, which include gate structures formed over fins. The fins are vertical, e.g., nominally perpendicular, to the surface of the substrate and can be rectangular or trapezoidal. In some embodiments, a fin can have rounded corners where its top surface and sidewalls meet. The fins can be formed using a variety of dry etch techniques, such as reactive ion etching or inductively coupled plasma etching. The fins can include S/D regions of finFETs. The S/D regions are located on both sides of a gate structure. FIGS. 1A and 1B illustrate an exemplary substrate provided in operation 1001.

A pre-clean process can be performed on the substrate. The pre-clean process can include any suitable cleaning processes, e.g., etching, to remove the contamination and/or impurities on the substrate. For example, the pre-clean process removes the oxide on the substrate. In some embodiments, the pre-clean process includes a dry etch process that removes the silicon oxide and other particles over the surface of the substrate.

In operation 1002, a titanium silicide layer is selectively formed using a relatively high flow rate of hydrogen and a relatively low flow rate of $TiCl_4$.

In some embodiments, the formation of titanium silicide layer starts with a preheat-preflow process. The preheat-preflow process allows gases for reaction to be flowed into the chamber, the chamber pressure to stabilize, and the stage to be heated to a desired reaction temperature. The gases for reaction can include $TiCl_4$ and hydrogen. In some embodiments, argon flows into the chamber for producing and stabilizing plasma in the subsequent deposition process. In some embodiments, the preheat-preflow process lasts about 31 seconds, which includes a preflow of precursor gas ($TiCl_4$) for about 3 seconds. In some embodiments, the flow rates of gases can be same as the flow rates in a subsequent deposition process. In some embodiments, a high ratio (e.g., in the range of about 25 to about 1500) of hydrogen to flow rate of $TiCl_4$ is used for the formation of titanium silicide layer. In some embodiments, the flow rate of $TiCl_4$ is about 3.5 sccm, and the flow rate of hydrogen is about 1000 sccm (e.g., resulting the ratio of flow rates of about 286). In some embodiments, the flow rate of argon is about 800 sccm, the chamber pressure is about 2 Torr, and the stage that carries the substrate is heated to about 420 degrees Celsius. In some embodiments, the preheat-preflow process can take an amount of time that is different than the amount of time for the chamber condition to stabilize. For example, gases can be flown into the chamber and reach a stable pressure in an amount of time different than an amount of time for the stage to heat to a desired temperature. The specific parameters of the preheat-preflow process is not limited to the examples disclosed herein.

In some embodiments, operation 1002 includes a deposition process after the preheat-preflow process. A titanium layer can be formed during the deposition process through reactions (1) and (2) described above. Meanwhile, a titanium silicide layer can be formed over the S/D region from the titanium layer reacting with the silicon in the S/D region, through reaction (4) described above. In some embodiments, the portion of the titanium layer over the gate structures is etched partially or entirely through reaction (3) described above. Reactions (1)-(4) can take place simultaneously or consecutively, thus forming a titanium silicide layer in the S/D region. In some embodiments, byproducts (e.g., titanium and/or $Cl_x$) are also formed in a contact region. The parameters of the deposition process are described above with respect to FIGS. 3-4. In some embodiments, a hydrogen flow rate of about 1000 sccm is used to achieve a high deposition rate of the titanium layer and a titanium silicide-rich texture at the S/D region. By controlling the deposition time, titanium silicide layer of a desired thickness can be formed in the S/D region.

In some embodiments, operation 1002 further includes a purge process after the deposition process. The purge process can evacuate the reaction chamber to remove undesired or unused particles/gases. In some embodiments, argon is used in the purge process. In some embodiments, the time of the purge process is about 60 seconds and the flow rate of the argon is about 2000 sccm.

In some embodiments, operation 1002 further includes a hydrogen treatment process after the purge process. The hydrogen treatment process allows hydrogen to be flown into the chamber to further remove residual gases (e.g., $TiCl_4$ and $TiCl_{x(x=2-3)}$), thus removing dangling bonds and undesired residuals on the surface of the substrate. In some embodiments, during the hydrogen treatment process, hydrogen is first flown into the chamber for a first period of time and RF power is then turned on for a second period of time. In some embodiments, the flow rate of hydrogen is about 1000 sccm in the hydrogen treatment process and the chamber pressure is about 2 Torr. In some embodiments, the total time of the hydrogen treatment process is about 50 seconds, which includes flowing hydrogen for about 30 seconds and plasma treatment for about 20 seconds. In some embodiments, the RF power for the plasma treatment is about 300 W.

In some embodiments, the cycle of the deposition process, the purge process, and the hydrogen treatment process are repeated multiple times before the subsequent formation of silicon nitride. The "cycle number" refers to the number of repetitive cycles. In some embodiments, for given chamber parameters, a higher cycle number results in a more conformal and more uniform titanium silicide layer. For example, the titanium silicide layer formed by the cycle number for 4 times is more conformal and uniform than the titanium silicide layer formed by the cycle number of 2. In some embodiments, for given chamber parameters, a higher cycle number results a lower selectivity of titanium silicide layer over titanium nitride (formed in the subsequent processes.) For example, the selectivity at the cycle number of 3 is lower than the selectivity at the cycle number of 1. For example, a lower cycle number can correspond to a longer deposition time to form a titanium silicide layer at a higher cycle number. In some embodiments, the cycle number is in the range of about 1-5 and the selectivity is in the range of about 3-7.

In operation 1003, a titanium nitride layer is selectively formed using a relatively low flow rate of hydrogen and a relatively high flow rate of $TiCl_4$.

In some embodiments, a transitional operation is performed after the formation of titanium silicide layer (e.g., the hydrogen treatment process) to set up the chamber environment for the formation of titanium nitride. For example, the transitional operation can include a purge process to remove the hydrogen gas in the chamber and a preflow process to flow in gases for reaction. In some embodiments, the plate temperature can be maintained at about 420 degrees Celsius. In some embodiments, the purge process includes flowing argon to remove the hydrogen gas. In some embodiments, the flow rate of argon is about 1200 sccm and the purge time is about 2 seconds. In some embodiments, the preflow process flows in TiCl$_4$ gas and hydrogen. In some embodiments, the preflow time is about 6 seconds, the chamber pressure is about 1 Torr, the flow rate of TiCl$_4$ is about 10 sccm, the flow rate of argon is about 1200 sccm, and the flow rate of hydrogen is about 10 sccm. In some embodiments, the transitional operation can include other numbers of processes to ramp up the gas flow in the chamber and stabilize the chamber environment.

In some embodiments, operation 1003 includes a deposition process after the transitional operation. A titanium layer can be formed during the deposition process through reactions (1) and (2). In some embodiments, the portion of the titanium layer over the gate structures is etched partially or entirely through reaction (3). Reactions (1)-(3) can take place simultaneously or consecutively, thus forming a titanium layer in the contact region. In some embodiments, byproducts (e.g., Cl$_x$) are also formed in the contact region. In some embodiments, the contact region may have a concentration of byproducts (e.g., Cl$_x$) in the range of about $1\times10^{16}$ amu to about $1\times10^{21}$ amu. The parameters of the deposition process is described with respect to FIG. 5 above. In some embodiments, a low ratio (e.g., in the range of about 0.25 to about 50) of flow rate of hydrogen to flow rate of TiCl$_4$ is used for the formation of titanium silicide layer. In some embodiments, a hydrogen flow rate of about 10 sccm and a TiCl$_4$ flow rate of about 10 sccm (e.g., resulting a ratio of flow rates of about 1) are used to achieve a highly selective formation of titanium nitride layer. For example, the relatively low hydrogen flow rate and the relatively high TiCl$_4$ flow rate can suppress the formation of titanium silicide, enabling a controllable thickness of titanium layer to be formed for the subsequent formation of titanium nitride layer. By controlling the deposition time, a titanium layer of a desired thickness can be formed over/in the contact region.

In some embodiments, operation 1003 further includes a hydrogen treatment process after the deposition process. In some embodiments, hydrogen gas is used to evacuate any unreacted gases (e.g., TiCl$_4$ and TiCl$_{x(x=2-3)}$), thus removing dangling bonds and residuals on the substrate. In some embodiments, the chamber pressure is about 1 Torr, the treatment time is about 3 seconds, and the flow rate of hydrogen is about 10 sccm. In some embodiments, argon is used to produce and stabilize plasma for removing dangling bonds. In some embodiments, the flow rate of argon is about 600 sccm and the RF power is about 300 W.

In some embodiments, operation 1003 further includes a nitridation process after the hydrogen treatment process. The nitridation process can start with a transitional operation to remove hydrogen and stabilize the chamber condition. In some embodiments, the transitional operation includes a purge sub-process and an evacuation sub-process. In some embodiments, the purge sub-process starts after the hydrogen treatment process to flow in argon and hydrogen. In some embodiments, the flow rate of argon is about 1800 sccm, the flow rate of hydrogen is about 10 sccm, the chamber pressure is about 0 Torr, and the time of the purge sub-process is about 10 seconds. In some embodiments, the evacuation sub-process is performed after the purge sub-process and is performed for about 2 seconds. In some embodiments, the chamber pressure is about 0 Torr in the transitional operation. In some embodiments, the transitional operation removes hydrogen not used in the subsequent reactions of the nitridation process. In some embodiments, the hydrogen for operation 1002 and the hydrogen for operation 1003 is flown into the reaction chamber through different gas inlets. Thus, the flow rates for the two operations can be separately controlled to obtain higher control precision. Accordingly, the flow rate of each operation can have improved precision.

In some embodiments, the nitridation process includes a nitrogen preflow sub-process. The nitrogen preflow sub-process can allow nitrogen gas to be flown into the chamber to create a nitrogen-rich atmosphere for the subsequent nitrogen treatment sub-process. The nitrogen gas can function with ammonia (e.g., subsequently flown into the chamber) to form an N-passive titanium nitride layer. The N-passive titanium nitride layer can provide an improved barrier between the contact layer and the gate structures. Meanwhile, argon is flown into the chamber to produce and stabilize plasma in subsequent sub-processes. In some embodiments, a flow rate of argon is about 2000 sccm, a flow rate of ammonia is about 4000 sccm, the chamber pressure is about 3 Torr, and the preflow time is about 12 seconds.

In some embodiments, the nitridation process further includes a nitrogen treatment sub-process (or nitrogen pre-treatment) after the nitrogen preflow sub-process. In the nitrogen treatment sub-process, nitrogen flown into the chamber can be ionized to create a nitrogen-rich atmosphere and nitrogen plasma. In some embodiments, the ionization process is combined with the subsequent ammonia flow and/or ammonia treatment to form an N-passive titanium nitride layer. In some embodiments, the RF power is about 500 W, a flow rate of nitrogen is about 4000 sccm, a nitrogen treatment time is about 20 seconds, a flow rate of argon is about 2000 sccm, the chamber pressure is about 3 Torr, and a flow rate of ammonia is about 4000 sccm.

In some embodiments, the nitridation process further includes an ammonia flow sub-process after the nitrogen preflow sub-process. The ammonia flow sub-process can flow ammonia gas into the chamber using hydrogen as the carrier gas, and establish the chamber condition for the subsequent reaction between ammonia and titanium. In some embodiments, the ammonia flow time is about 12 seconds, a flow rate of argon is about 2000 sccm, the chamber pressure is about 3 Torr, a flow rate of hydrogen is about 4500 sccm, and a flow rate of ammonia is about 4000 sccm.

In some embodiments, the nitridation process further includes an ammonia treatment sub-process after the ammonia flow sub-process. In some embodiments, the ammonia treatment sub-process enables ammonia (using hydrogen as the carrier gas) to react with the titanium layer formed over the contact region (e.g., titanium layers formed during operation 1002 and the deposition process of operation 1003) to form a titanium nitride layer over the contact region. In some embodiments, reaction (5) described in FIG. 6 above takes place with the presence of nitrogen plasma to form an N-passive titanium nitride layer over the contact layer. In some embodiments, the ammonia flow time is about 20 seconds, a flow rate of argon is about 2000 sccm, the chamber pressure is about 3 Torr, a flow rate of hydrogen is about 4500 sccm, an RF power is about 500 W, and a flow rate of ammonia is about 4000 sccm.

In some embodiments, after the titanium nitride layer is formed and before a contact layer is deposited in the contact region, a pull-back process is performed. The pull-back process can remove an excess thickness of titanium nitride and result in a titanium nitride layer of a desired thickness and smoothness. In some embodiments, the pull-back process includes rinsing the substrate with $H_2O_2$.

In some embodiments, after the formation of titanium nitride layer and/or the pull-back process, a contact layer is formed in the contact region. The contact layer can form contact with the titanium nitride. The contact layer can include any suitable metal or metal alloys formed by any suitable deposition method. For example, the contact layer can include aluminum, copper, cobalt, any other suitable metal, or any combination thereof. In some embodiments, the contact layer includes cobalt.

Forming the titanium silicide layer and the titanium nitride layer in sequential CVD depositions in a same reaction chamber allows the thicknesses of the titanium silicide layer and the titanium nitride layer to be controlled through adjusting the flow rates of hydrogen and precursor $TiCl_4$. In other words, a titanium silicide layer or a titanium nitride layer can be selectively formed/deposited by choosing suitable gas flow rates of hydrogen and $TiCl_4$ (or the ratio of the flow rate of hydrogen to the flow rate of $TiCl_4$). Meanwhile, a thickness ratio of the titanium silicide layer to the titanium nitride layer can be controlled. Before the formation of the two layers, the reaction chamber can be evacuated to remove potential contamination and the condition of the reaction chamber can be established for sequential CVD depositions. In addition, no switching of reaction chambers is necessary so that the formed titanium silicide layer and the titanium nitride layer can have improved film quality and conformality, and the fabrication time can be reduced. The formed structure can thus have reduced parasitic resistance between the contact layer and the S/D region and improved barrier between the contact layer and the gate structures.

In some embodiments, a method of fabricating a semiconductor structure includes providing a substrate with a gate structure, an insulating structure over the gate structure, and a S/D region, and depositing a titanium silicide layer over the S/D region with a first CVD process. The first CVD process includes a first hydrogen gas flow. The method also includes depositing a titanium nitride layer over the insulating structure with a second CVD process. The second CVD process includes a second hydrogen gas flow. The first and second CVD processes are performed in a single reaction chamber and a flow rate of the first hydrogen gas flow is higher than a flow rate of the second hydrogen gas flow.

In some embodiments, a method of fabricating a semiconductor structure includes providing a substrate, the substrate including a source and/or drain (S/D) region; depositing a titanium silicide layer over the S/D region using a first deposition process, the first deposition process including a first hydrogen-to-precursor flow rate ratio; and depositing a titanium nitride layer over the titanium silicide layer using a second deposition process, the second deposition process including a second hydrogen-to-precursor flow rate ratio. The first hydrogen-to-precursor flow rate ratio is greater than the second hydrogen-to-precursor flow rate ratio.

In some embodiments, a semiconductor structure includes: a substrate, the substrate including a first gate structure, a first insulating structure over the first gate structure, a second gate structure, a second insulating structure over the second gate structure, and a S/D region between the first gate structure and the second gate structure. The semiconductor structure further includes a titanium nitride layer over sidewalls of the first insulating structure and the second insulating structure; a titanium silicide layer over the S/D region; and a contact layer over titanium silicide layer and between the first insulating structure and the second insulating structure. A ratio of a thickness of the titanium silicide layer to a thickness of the titanium nitride layer is in a range of about 3 to about 7.

It is to be appreciated that the Detailed Description section, and not the Abstract of the Disclosure, is intended to be used to interpret the claims. The Abstract of the Disclosure section can set forth one or more but not all exemplary embodiments contemplated and thus, are not intended to be limiting to the subjoined claims.

The foregoing disclosure outlines features of several embodiments so that those skilled in the art can better understand the aspects of the present disclosure. Those skilled in the art will appreciate that they can readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they can make various changes, substitutions, and alterations herein without departing from the spirit and scope of the subjoined claims.

What is claimed is:

1. A semiconductor structure, comprising:
   a substrate;
   first and second gate structures disposed on the substrate;
   first and second insulating structures disposed on the first and second gate structures, respectively;
   a source/drain (S/D) region disposed between the first and second gate structures;
   a titanium silicide layer disposed on the S/D region, wherein a top surface of the titanium silicide layer is at a first surface plane that is vertically higher than a top surface of a channel region under the first gate structure and wherein a bottom surface of the titanium silicide layer is at a second surface plane that is vertically lower than the top surface of the channel region;
   a titanium nitride layer disposed on the titanium silicide layer and on sidewalls of the first and second insulating structures,
   wherein sidewalls of the S/D region, the titanium silicide layer, and the titanium nitride layer are coplanar with respect to each other; and
   a contact layer disposed on the titanium nitride layer and between the first and second insulating structures.

2. The semiconductor structure of claim 1, wherein a ratio of a thickness of the titanium silicide layer to a thickness of the titanium nitride layer is in a range of 3 to 7.

3. The semiconductor structure of claim 1, further comprising first and second spacers disposed on sidewalls of first and second gate structures, respectively, wherein the titanium nitride layer is disposed on sidewalls of the first and second spacers.

4. The semiconductor structure of claim 1, further comprising first and second spacers disposed on sidewalls of first and second gate structures, respectively, wherein the titanium silicide layer is disposed on sidewalls of the first and second spacers.

5. The semiconductor structure of claim 1, further comprising first and second spacers disposed on sidewalls of first and second gate structures, respectively, wherein a thickness of the titanium silicide layer on the S/D region is greater than a thickness of the titanium nitride layer on sidewalls of the first and second spacers.

6. The semiconductor structure of claim 1, wherein:
the titanium nitride layer has a thickness between 1 nm and 4 nm; and
the titanium silicide layer has a thickness between 7 and 10 nm.

7. The semiconductor structure of claim 1, wherein a layer coverage between a cross-sectional length of the titanium silicide layer and a cross-sectional length of the S/D region is in a range from 65% to 81%.

8. The semiconductor structure of claim 1, wherein a thickness ratio between a minimum thickness of the titanium silicide layer and a maximum thickness of the titanium silicide layer is in a range from 35% to 59%.

9. The semiconductor structure of claim 1, wherein the contact layer comprises cobalt and the S/D region comprises an N-type dopant.

10. The semiconductor structure of claim 1, wherein the contact layer comprises cobalt and the S/D region comprises a P-type dopant.

11. A fin field effect transistor (finFET) device, comprising:
a substrate;
a fin structure disposed on the substrate;
a source/drain (S/D) region disposed on a first portion of the fin structure;
a gate structure with a gate dielectric layer disposed on a second portion of the fin structure;
a titanium silicide layer disposed on the S/D region, wherein a top surface of the titanium silicide layer is at a first surface plane that is vertically higher than a top surface of the gate dielectric layer and wherein a bottom surface of the titanium silicide layer is at a second surface plane that is vertically lower than the top surface of the gate dielectric layer; and
a titanium nitride layer disposed on the titanium silicide layer,
wherein sidewalls of the S/D region, the titanium silicide layer, and the titanium nitride layer are coplanar with respect to each other.

12. The finFET device of claim 11, wherein a ratio of a thickness of the titanium silicide layer to a thickness of the titanium nitride layer is in a range of 3 to 7.

13. The finFET device of claim 11, further comprising a spacer disposed on a sidewall of the gate structure, wherein the titanium nitride layer is disposed on the spacer.

14. The finFET device of claim 11, further comprising a spacer disposed on a sidewall of the gate structure, wherein the titanium nitride layer is disposed on the spacer.

15. The finFET device of claim 11, wherein a thickness of the titanium silicide layer on the S/D region is greater than a thickness of the titanium nitride layer on a sidewall of the gate structure.

16. The finFET device of claim 11, further comprising an other fin structure disposed on the substrate, wherein the S/D region is a merged S/D region disposed on the fin structure and the other fin structure.

17. A semiconductor device, comprising:
a substrate;
a source/drain (S/D) region disposed on the substrate;
a gate structure with a gate dielectric layer disposed on the substrate;
a titanium silicide layer disposed on the S/D region, wherein a top surface of the titanium silicide layer is at a first horizontal plane that is vertically higher than a top surface of the gate dielectric layer and wherein a bottom surface of the titanium silicide layer is at a second horizontal plane that is vertically lower than the top surface of the gate dielectric layer; and
a titanium nitride layer disposed on the titanium silicide layer,
wherein sidewalls of the S/D region, the titanium silicide layer, and the titanium nitride layer are coplanar with respect to each other.

18. The semiconductor device of claim 17, wherein a thickness of the titanium silicide layer on the S/D region is greater than a thickness of the titanium nitride layer on a sidewall of the gate structure.

19. The semiconductor device of claim 17, wherein a ratio of a thickness of the titanium silicide layer to a thickness of the titanium nitride layer is in a range of 3 to 7.

20. The semiconductor device of claim 17, further comprising a contact plug disposed on the titanium silicide layer.

* * * * *